(12) United States Patent
Nakamura et al.

(10) Patent No.: US 6,344,778 B1
(45) Date of Patent: Feb. 5, 2002

(54) VOLTAGE-CONTROLLED OSCILLATOR, PHASE SYNCHRONIZATION CIRCUIT AND SIGNAL PROCESSING CIRCUIT

(75) Inventors: Norio Nakamura, Yokohama; Katsuyuki Omi, Kamakura; Toshio Shiramatsu, Yokohama; Nobuyasu Goto, Yokohama; Masaru Hashimoto, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/596,056

(22) Filed: Jun. 16, 2000

(30) Foreign Application Priority Data

Jun. 18, 1999  (JP) ............................................ 11-173014
May 30, 2000  (JP) ............................................ 12-160191

(51) Int. Cl.[7] ................................................. H03B 5/24
(52) U.S. Cl. ..................... 331/34; 331/108 B; 331/135; 331/177 R; 360/51
(58) Field of Search ........................ 331/34, 57, 108 B, 331/135–137, 177 R; 327/156–159; 360/57; 375/376; 455/260

(56) References Cited

U.S. PATENT DOCUMENTS 4,914,401 A * 4/1990 Mader .......................... 330/261
5,564,089 A * 10/1996 Barrett, Jr. ................ 455/196.1
5,712,601 A * 1/1998 Shimada et al. ........ 331/177 R

FOREIGN PATENT DOCUMENTS

| JP | 2-279004 | 11/1990 |
| JP | 8-237028 | 9/1996 |
| JP | 9-294020 | 11/1997 |
| JP | 9-326636 | 12/1997 |

* cited by examiner

*Primary Examiner*—David Mis
(74) *Attorney, Agent, or Firm*—Oblon, Spivak, McClelland, Maier & Neustadt, P.C.

(57) ABSTRACT

A delay-time variable filter delays an input signal by a desired time according to a control signal from a control input node and outputs the delayed input signal, and a positive feedback loop circuit changes the output signal (sinusoidal wave signal) from this filter, and provides a positive feedback of the binary pulse signal to the input side of the filter at a desired level for carrying out an oscillation. This positive feedback loop circuit includes a circuit for changing the signal into a binary signal and providing a positive feedback of the binary signal to the input of the filter by limiting the signal at a desired amplitude. As the delay-time variable filter, a quartic Butterworth low-pass filter is used, for example. As the positive feedback loop circuit, there is used a voltage comparator circuit that changes an input signal into a binary signal and outputs a pulse signal of a desired amplitude.

9 Claims, 14 Drawing Sheets

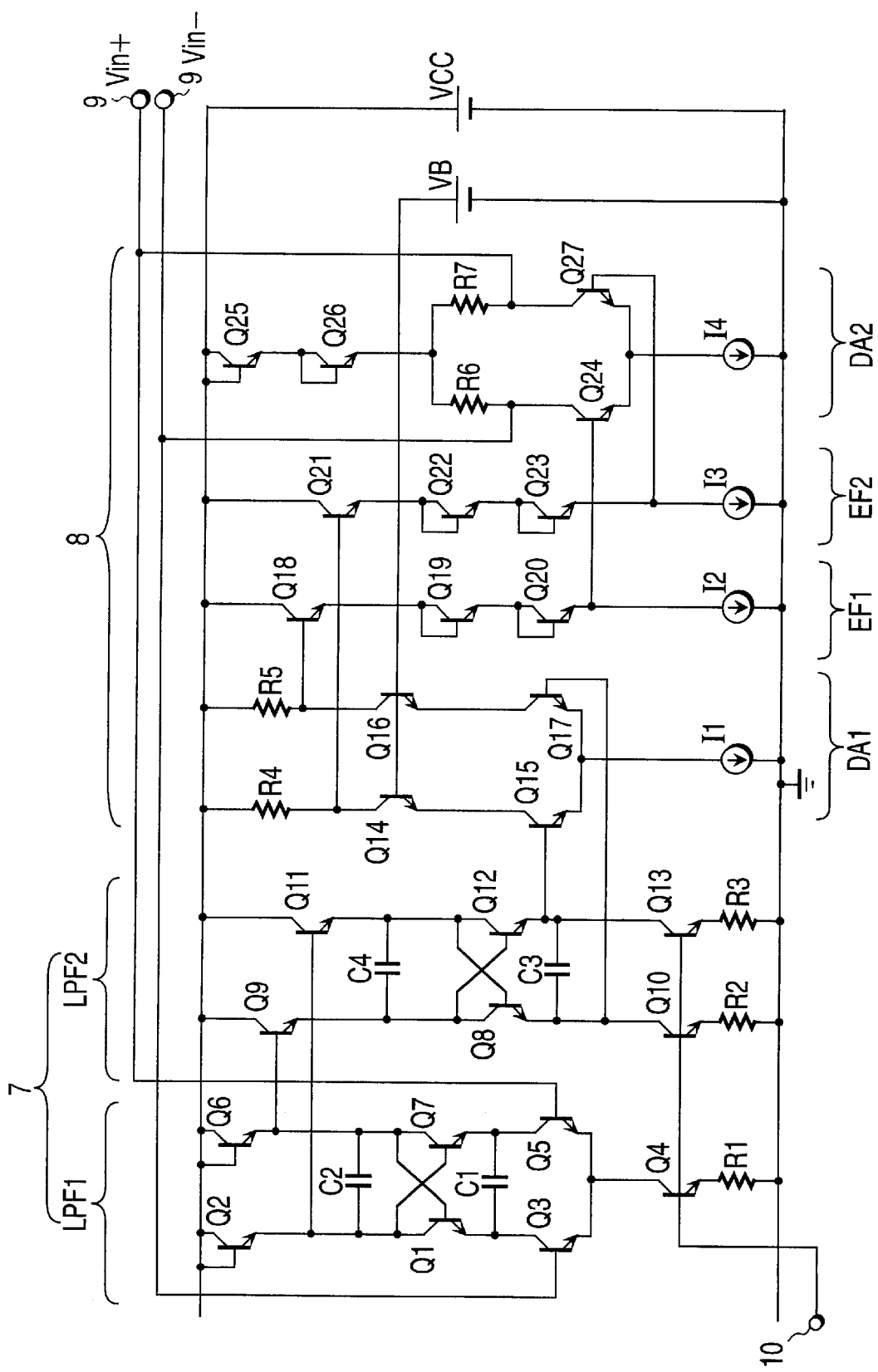
F I G. 5A

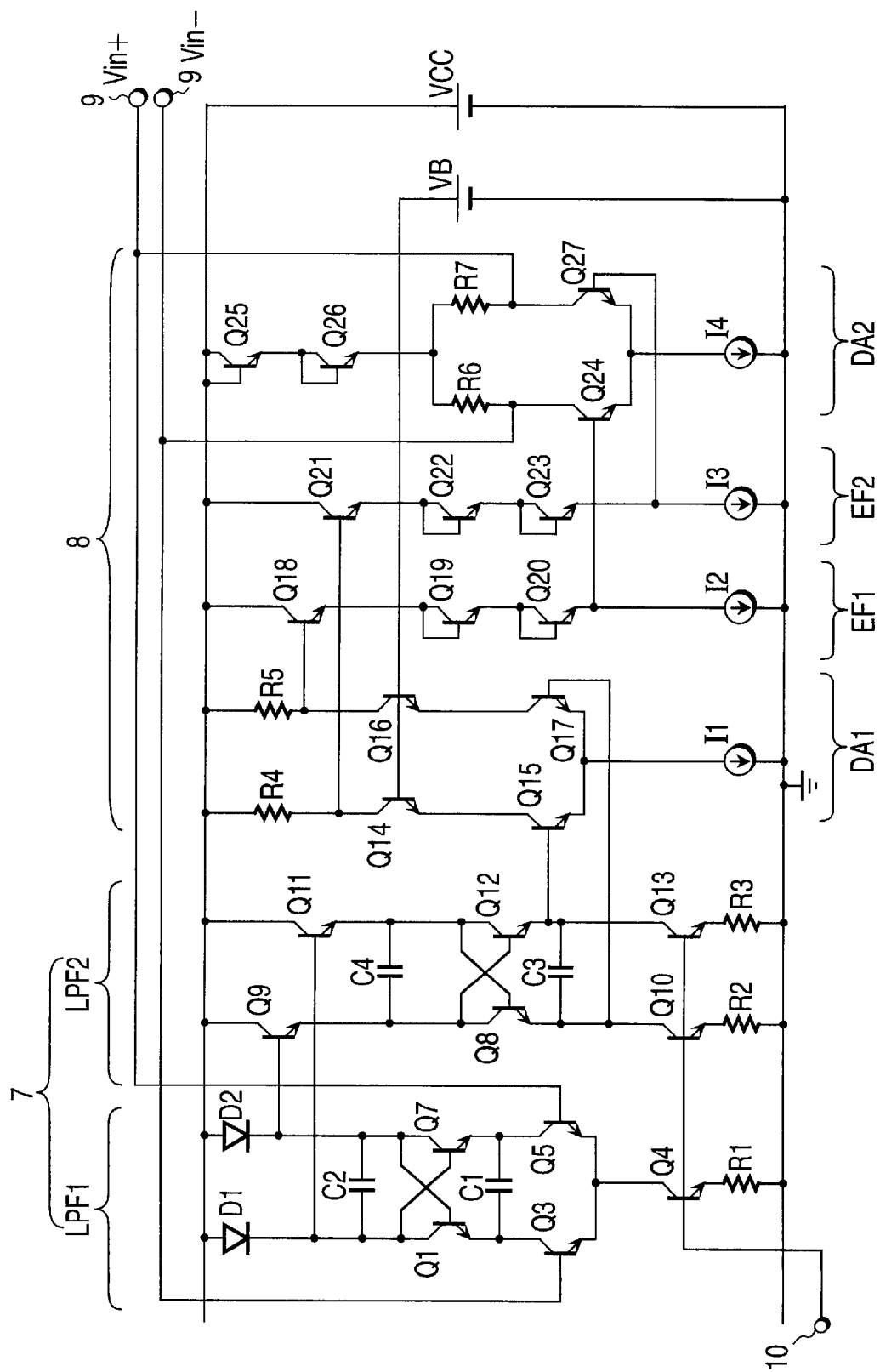
F I G. 5B

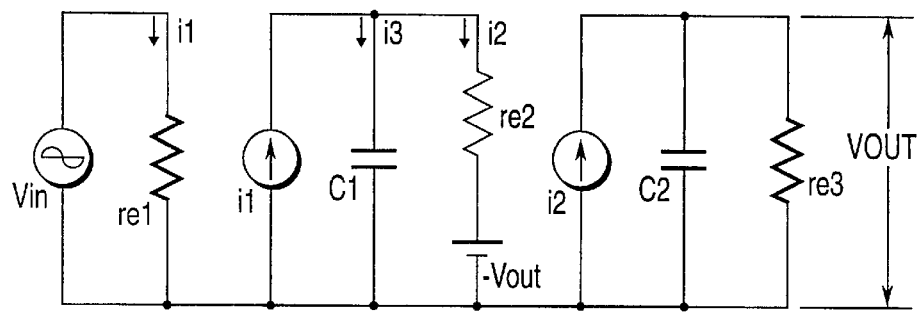
FIG. 6
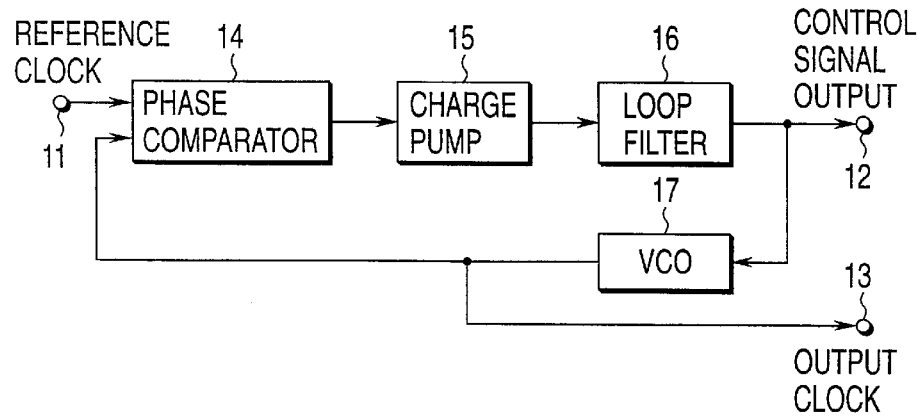
FIG. 7
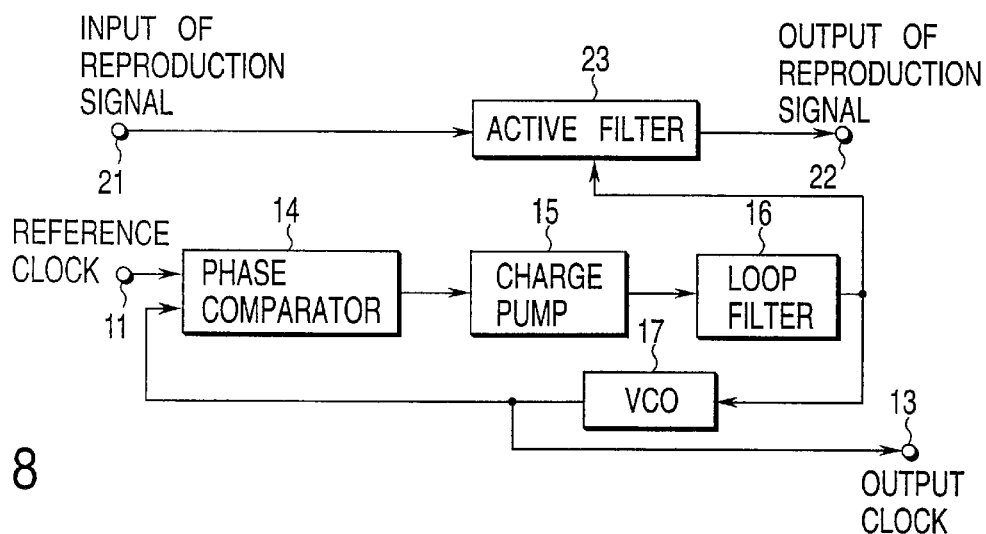
FIG. 8
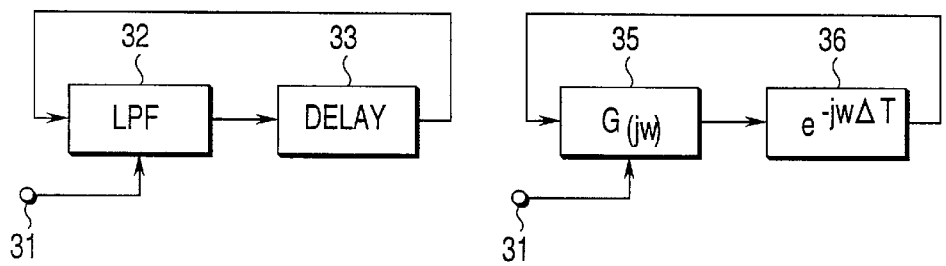
FIG. 9A
FIG. 9B

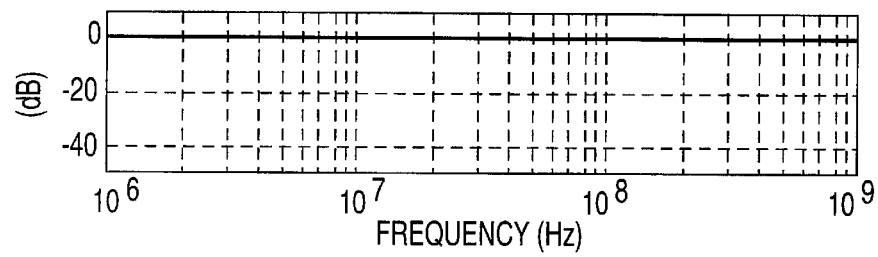
F I G. 10A
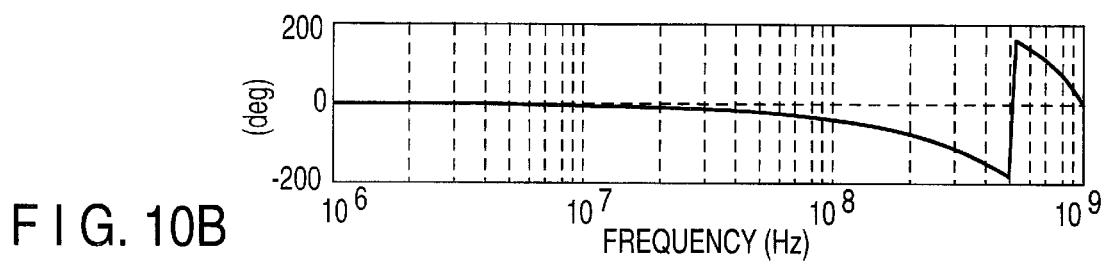
F I G. 10B
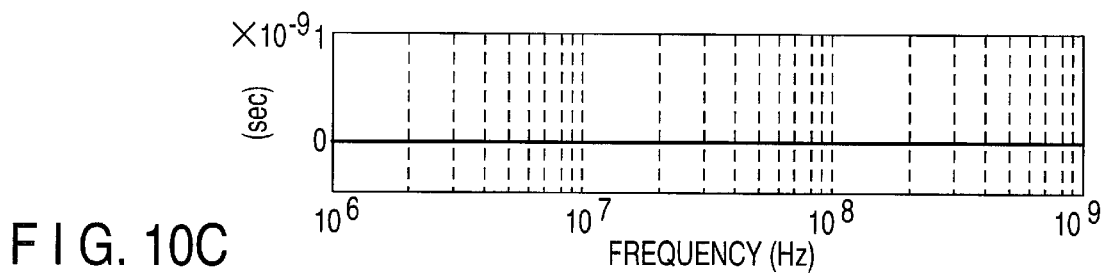
F I G. 10C
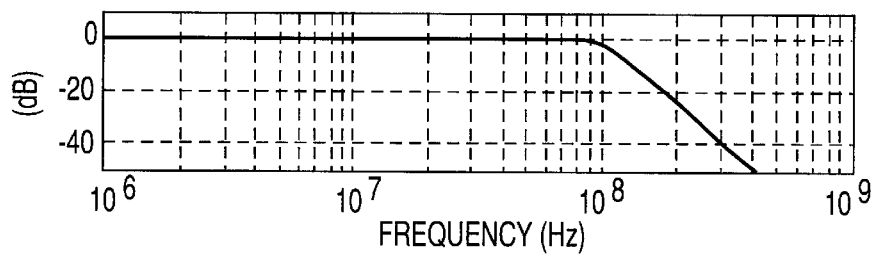
F I G. 11A
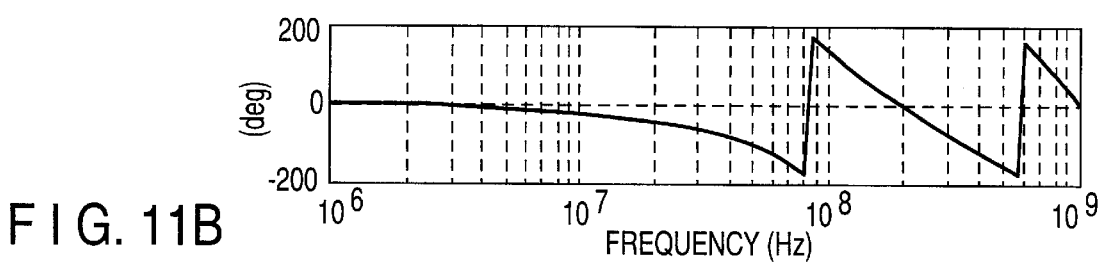
F I G. 11B
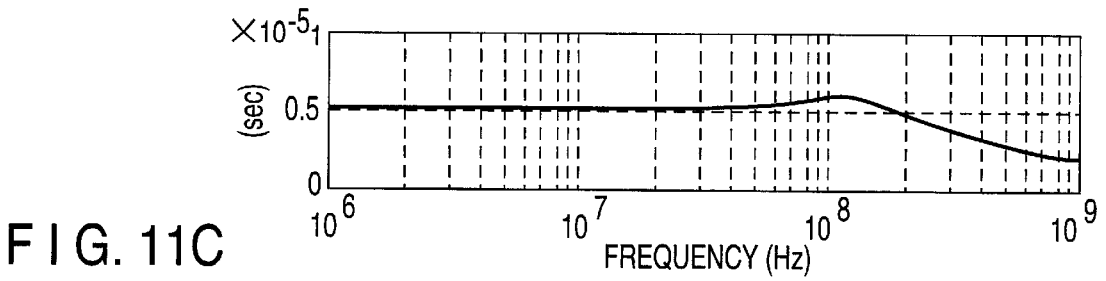
F I G. 11C

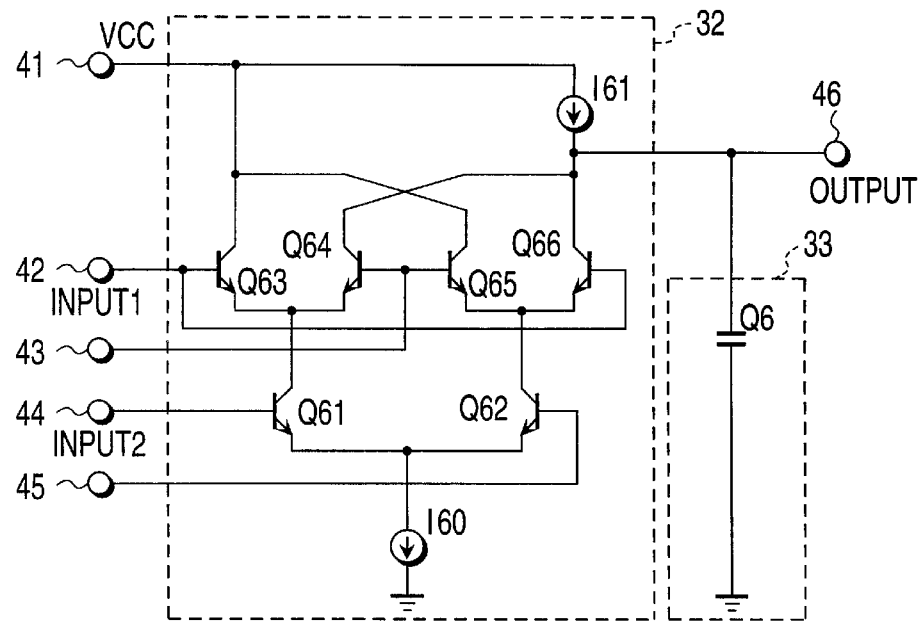
F I G. 15
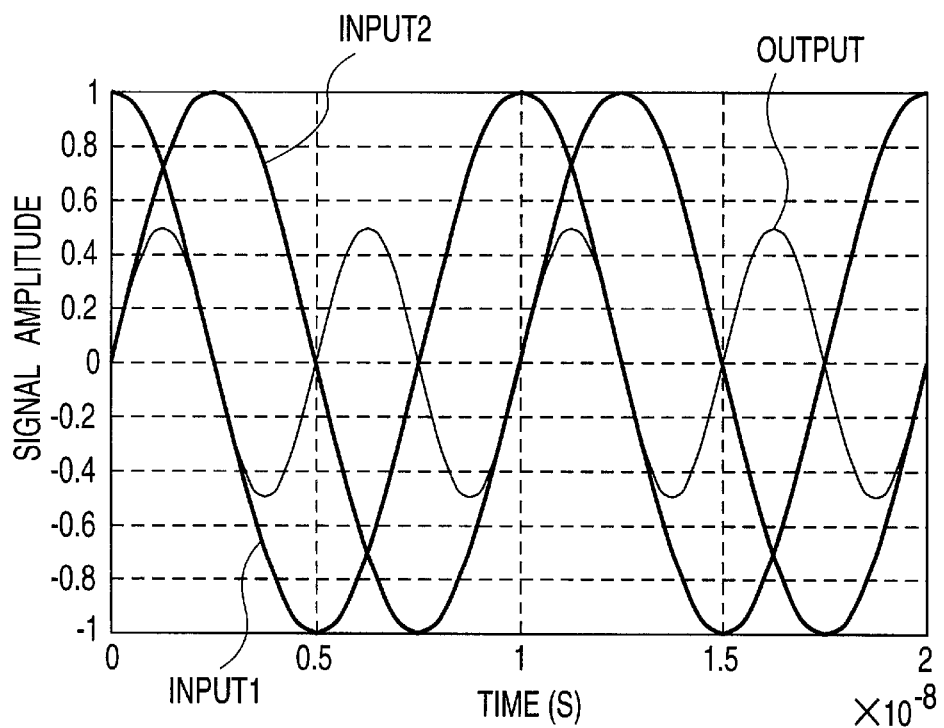
F I G. 16

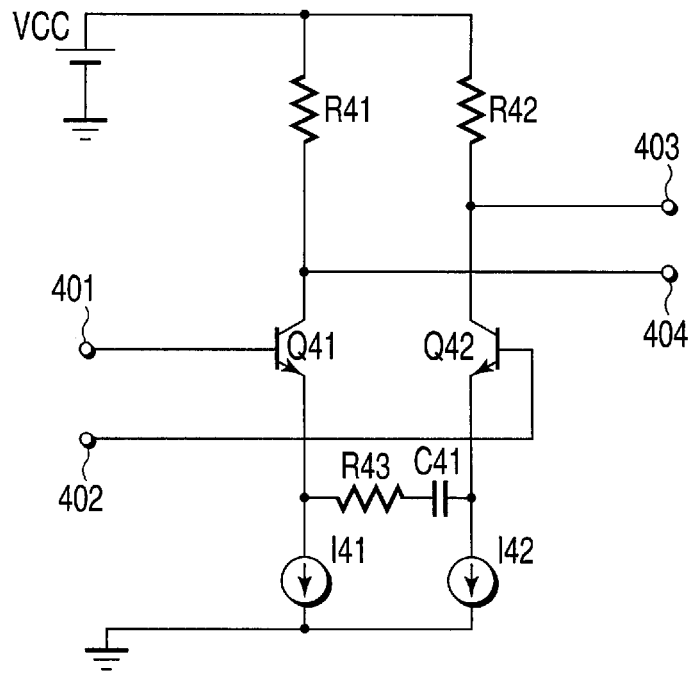
F I G. 27
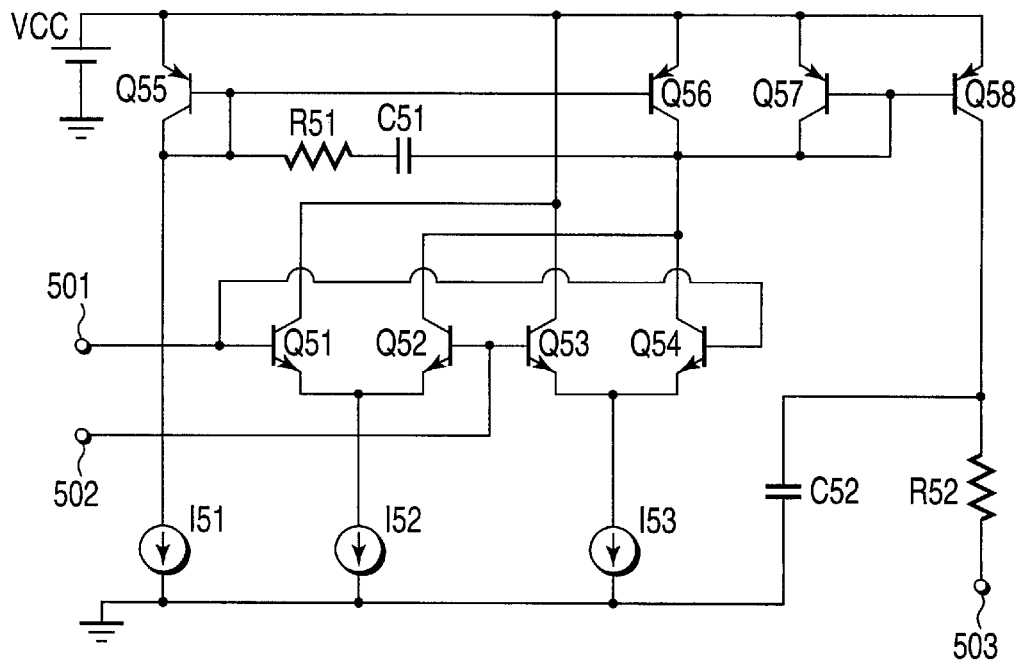
F I G. 28

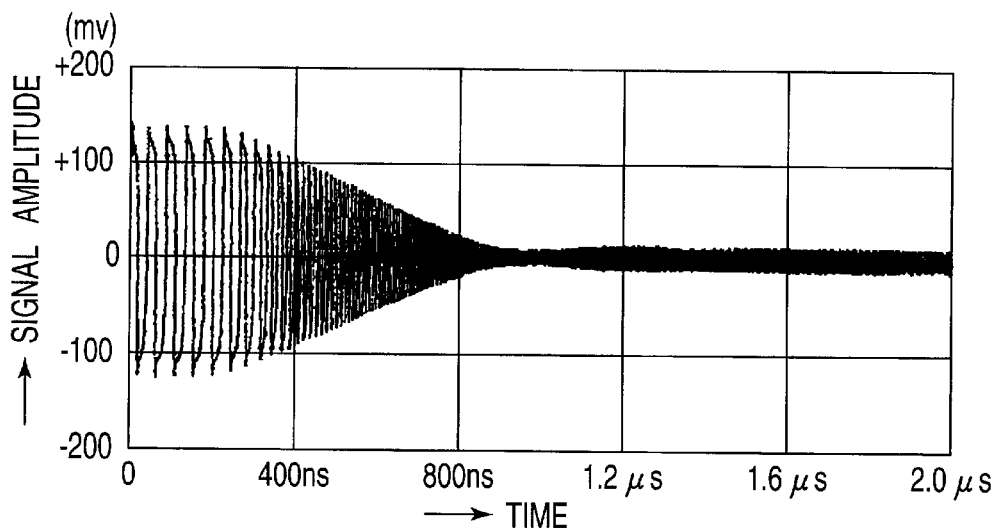
F I G. 29
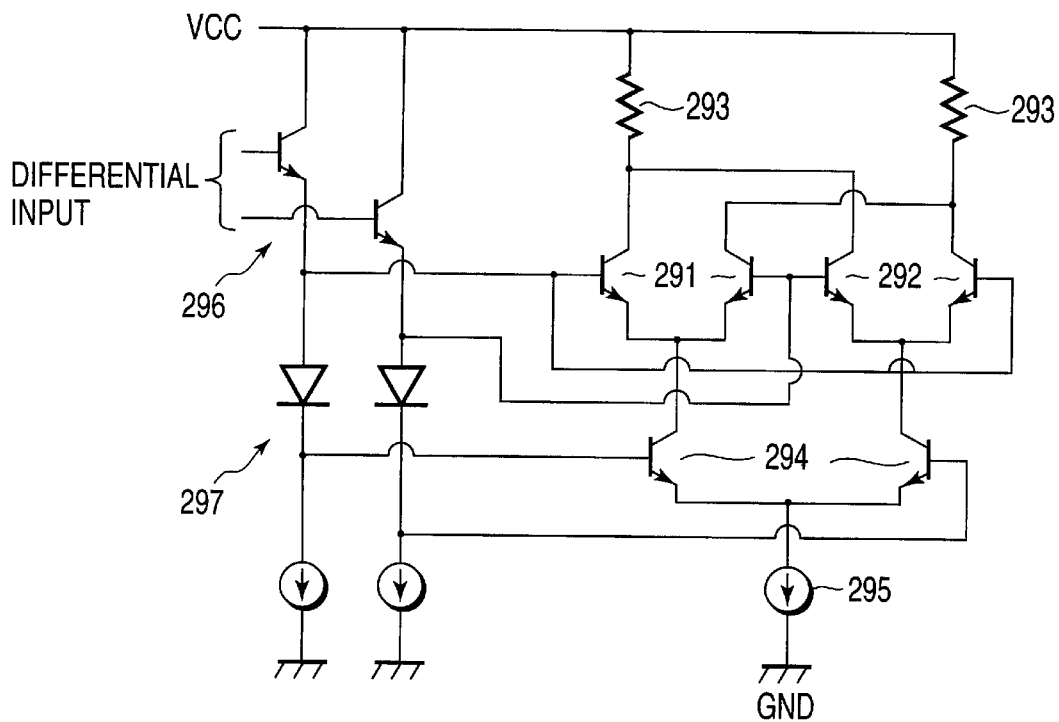
F I G. 30

VOLTAGE-CONTROLLED OSCILLATOR, PHASE SYNCHRONIZATION CIRCUIT AND SIGNAL PROCESSING CIRCUIT

CROSS-REFERENCE TO RELATED APPLICATIONS

This application is based upon and claims the benefit of priority from the prior Japanese Patent Applications No. 11-173014, filed Jun. 18, 1999; and No. 2000-160191, filed May 30, 2000, the entire contents of which are incorporated herein by reference.

BACKGROUND OF THE INVENTION

The present invention relates to a voltage-controlled oscillator capable of changing an oscillation frequency according to a control voltage or a control current, and a phase synchronization circuit and a signal processing circuit using the voltage-controlled oscillator. The invention relates to a voltage-controlled oscillator, a phase synchronization circuit and a signal processing circuit that are used, for example, in an information processing field such as a communication device, a hard disk driving unit, and an information storage device like an optical disk.

In a communication device or an information storage device, a phase synchronization circuit (or a phase-locked loop; PLL) has been used for extracting a clock signal to discriminate received data or reproduced data. As one of basic construction blocks of this PLL, there has been used a voltage-controlled oscillator (VCO) that has a function of changing an oscillation frequency according to a control voltage or a control current. It is general that a PLL including a VCO is constructed on the same LSI chip by combining the PLL with other functional block like an equalizer.

As a conventional VCO that is used in an information storage device, a multi-vibrator type circuit utilizing a charge and discharge to and from a capacitor has been used. The oscillation frequency of the multi-vibrator type VCO depends on three parameters including a capacity of the capacitor, charge and discharge currents of the capacitor, and a voltage between both terminals of the capacitor. Usually, in many cases, the oscillation frequency is controlled based on either the voltage between both terminals of the capacitor or the charge and discharge currents, with the capacity of the capacitor set constant.

According to the conventional multi-vibrator type VCO, the oscillation frequency of the VCO is controlled based on the voltage. Circuit noise attributable to voltage can be easily mixed into a control input voltage. Therefore, the oscillation frequency is easily affected by the noise due to voltage. As a result, there has been a problem that the oscillation frequency of the VCO is unstable against crosstalk noise, and it is difficult to achieve a stable oscillation. Further, there has been a problem that the oscillation frequency is also easily affected by crosstalk from other circuit blocks constructed within the same LSI chip, which makes the oscillation frequency unstable.

The above problems lead to an extreme aggravation of the performance of the device using a PLL including the conventional multi-vibrator type VCO. For example, an error rate is worsened in the information storage device.

On the other hand, as shown in FIG. 1, there has been an analog VCO consisting of a filter 301 and an automatic gain control (AGC) circuit 302. The AGC circuit 302 provides a positive feedback of an output signal of the filter 301 to an input side of the filter by controlling the output signal at a constant level. This VCO is disclosed, for example, in Japanese Patent Application Laid-open Publication No. 9-326636. The analog-type VCO using the filter has characteristics that the VCO is not easily affected by noise due to voltage, and is not easily affected by crosstalk noise from other circuit blocks.

However, the analog-type VCO using the filter has a problem in that the AGC circuit 302 has a complex construction. Further, the operation frequency area is limited to a low level based on the construction of the filter 301 and a amplitude detector 303 for detecting an output level of the AGC circuit 302. For example, an envelope-detection type amplitude detector as disclosed in Japanese Patent Application Laid-open Publication No. 9-326636 cannot accurately detect a signal in a high-frequency area, particularly, a signal exceeding a few hundred MHz. Therefore, a VCO using this amplitude detector cannot stably oscillate a signal exceeding a few hundred MHz. The data transfer speed of a device using a VCO has been increasing in recent years, and it is difficult to meet future demand for such high transfer-speed based on the conventional VCO.

As explained above, the analog-type VCO using the filter has the problems that the AGC circuit has a complex construction, and that the operation frequency area is limited to a low level by the construction of the filter and the amplitude detector of the AGC circuit.

In recent years, it is general that a waveform equalization filter is constructed on the same integrated circuit chip as that of a preamplifier and a PLL. When a filter is constructed on the integrated circuit chip, the characteristics of the chip are determined by the capacity of the capacitor constructed on the integrated circuit chip and the volume of a current flown through the capacitor.

In this case, the capacity of the capacitor constructed on the integrated circuit chip has a variance of plus minus 15%, which leads to a fluctuation in the frequency characteristics of the waveform equalization filter. As a result, equalization errors occur. Therefore, it has been desired to realize a filter having a frequency characteristic compensation function with high precision of frequency characteristics.

Consider a case where an active filter used for equalizing a reproduction signal and a PLL are structured together on the same LSI chip in a signal regenerating unit such as, for example, a hard disk driving unit, an optical disk driving unit, a data tape driving unit, etc.

When a signal reproduction speed of a signal generator has changed, it is usually necessary to optimize the cutoff frequency of the active filter according to this change. Further, it is also necessary to change the oscillation frequency and response characteristics of the PLL according to the change in the signal reproduction speed.

As described above, when the conventional PLL and the active filter for equalizing a reproduction signal are structured together on the same LSI chip, the active filter and the PLL are adjusted independent of each other. Therefore, these adjustments have had a problem of extremely lowering the productivity in the manufacturing process.

BRIEF SUMMARY OF THE INVENTION

It is, therefore, an object of the present invention to provide a voltage-controlled oscillator that can be easily realized in an integrated circuit in a simple construction without an AGC circuit, and that makes it possible to supply a low-cost product. This object is to be achieved by arranging such that a delay-time variable filter controls a delay time according to a control signal input, and an output signal of the delay-time variable filter is changed into a binary pulse signal, and this signal is positively fed back to the input side of the delay-time variable filter at a desired level.

It is another object of the present invention to provide a voltage-controlled oscillator that can stably oscillate a signal in excess of a few hundred MHz, that can be easily realized in an integrated circuit, and that makes it possible to supply a low-cost product by inventive constructions of a filter and an amplitude detector of an AGC circuit. This object is to be achieved by a system in which a delay-time variable filter controls a delay time according to a control signal input, and an output signal of the delay-time variable filter is controlled at a constant level by an AGC circuit and is positively fed back to the input side of the delay-time variable filter.

It is still another object of the present invention to provide a phase synchronization circuit capable of generating a clock signal of high quality in a stable operation.

It is still another object of the present invention to provide a signal processing circuit capable of canceling aggravation in the characteristics of an active filter due to a variance in the capacity of capacitors. This object is to be achieved by linking the phase synchronization circuit to the active filter and by using a control voltage input of a voltage-controlled oscillator in a phase synchronization circuit as a control signal for setting the cutoff frequency of the active filter.

In order to achieve the above objects, according to a first aspect of the present invention, there is provided a voltage-controlled oscillator comprising: a delay-time variable filter having a signal input node, a signal output node and a control signal input node, a signal delay time between the signal input node and the signal output node being controlled according to a control signal input from the control signal input node; and a feedback loop circuit configured to receive an output signal from the delay-time variable filter and provide a positive feedback of a binary pulse signal of the output signal to the signal input node of the delay-time variable filter at a desired level.

According to a second aspect of the invention, there is provided a voltage-controlled oscillator comprising: a delay-time variable filter having a signal input node, a signal output node and a control signal input node, a signal delay time between the signal input node and the signal output node being controlled according to a control signal input from the control signal input node; a variable gain amplifier having a gain variable control signal input node, and having an amplification gain according to a gain variable control signal input from the gain variable control signal input node, configured to receive an output signal of the delay-time variable filter, amplify this received output signal, and provide a positive feedback of the amplified signal to the signal input node of the delay-time variable filter; and a sinusoidal wave detection-type amplitude detector configured to receive an amplitude corresponding to an output signal of the variable gain amplifier, detect the received amplitude, generate a negative feedback signal for controlling the amplitude corresponding to the output signal of the variable gain amplifier so that the amplitude substantially becomes a desired constant value, and supply the negative feedback signal to the gain variable control signal input node of the variable gain amplifier as the gain variable control signal.

Further, according to a third aspect of the invention, there is provided a phase synchronization circuit comprising: a delay-time variable filter having a first signal input node, a first signal output node and a first control signal input node, a signal delay time between the first signal input node and the first signal output node being controlled according to a first control signal input from the first control signal input node; a feedback loop circuit configured to receive an output signal from the delay-time variable filter, provide a positive feedback of a binary pulse signal of the output signal to the first signal input node of the delay-time variable filter at a desired level, and output the pulse signal as a clock signal; a phase comparator having a second signal input node and a third signal input node, configured to receive a reference clock signal in the second signal input node and receive the clock signal output from the feedback loop circuit in the third signal input node; a charge pump circuit configured to receive an output of the phase comparator; a loop filter configured to receive an output of the charge pump circuit, generate the first control signal according to the output of the charge pump circuit, and provide the generated first control signal to the first control signal input node; and an active filter having a fourth input signal node and a second control signal input node, configured to receive a signal to be processed in the fourth input signal node, and receive an output of the loop filter in the second control signal input node.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A and 5B are circuit diagrams showing one detailed example of the VCO shown in FIG. 3.

FIG. 6 is a diagram showing an equivalent circuit of an LPF LPF1 shown in FIG. 5.

FIG. 7 is a block diagram showing a construction of a PLL according to the present invention.

FIG. 8 is a block diagram showing a construction of a signal processing circuit used in an information storage device, a communication device, etc., according to the present invention.

FIGS. 9A and 9B are a block diagram for showing an outline of construction elements relating to delay operation of the VCO shown in FIG. 8, and a block diagram for expressing these elements by a transfer function.

FIGS. 10A to 10C are characteristic diagrams showing one example of frequency versus amplitude characteristics, frequency versus phase characteristics, and frequency versus amplitude delay characteristics (relative delay characteristics) of a parasitic delay shown in FIG. 9B respectively.

FIGS. 11A to 11C are diagrams showing frequency characteristics of a case where a parasitic delay shown in FIG. 9B is included in the oscillation loop of the VCO having frequency characteristics shown in FIGS. 4A to 4C.

FIG. 15 is a circuit diagram showing a detailed example of a multiplier and an integrator in the correction circuit block shown in FIG. 12 respectively.

FIG. 16 is a waveform diagram showing one example of waveforms of two input signals and one output signal of the multiplier shown in FIG. 15.

FIG. 27 is a circuit diagram showing one detailed example of a fixed gain amplifier shown in FIG. 24.

FIG. 28 is a circuit diagram showing one detailed example of an amplitude detector shown in FIG. 24.

FIG. 29 is a characteristic diagram showing one example of convergence characteristics of an output signal amplitude of a variable gain amplifier shown in FIG. 26.

FIG. 30 is a circuit diagram showing other detailed example of the amplitude detector shown in FIG. 24.

DETAILED DESCRIPTION OF THE INVENTION

Embodiments of the present invention will be explained in detail with reference to the attached drawings.

Figure 1:
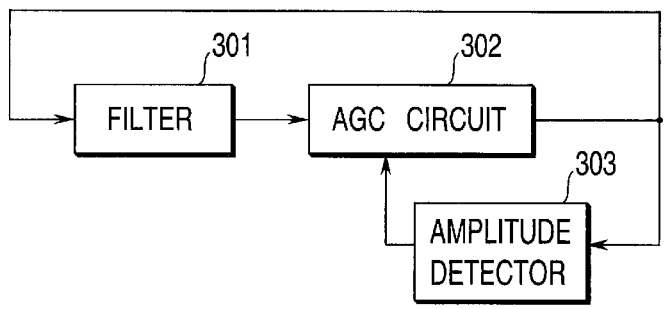
FIG. 1 is a block diagram showing one example of a conventional VCO.
Figure 2:
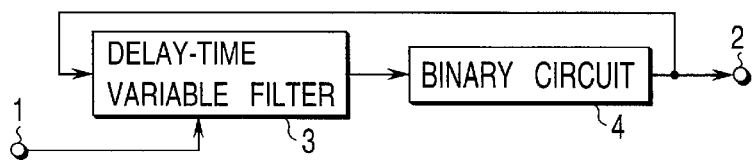
FIG. 2 is a block diagram showing a VCO relating to the present invention.

FIG. 2 shows a flock construction of a VCO relating to the present invention.

In the VCO shown in FIG. 2, a reference number 1 denotes a control input node to which a control signal is input, and 2 denotes a signal output node. A reference number 3 denotes a delay-time variable filter for delaying an input signal by a desired time according to a control signal from the control input node 1, and outputting the delayed input signal. There is provided a positive feedback loop circuit which positively feeds back a binary pulse signal of an output signal (a sinusoidal wave) of the filter 3 to the input side of the filter 3 at a desired level, thereby to carry out an oscillation. This positive feedback loop circuit includes a binary circuit 4 for changing a signal into a binary signal, limiting this signal to a desired amplitude, and providing a positive feedback of the amplitude-limited binary signal to the input side of the filter 3.

When the delay-time variable filter 3 used has a characteristic that the phase of the output signal is inverted from the phase of the input signal, there may be used a circuit for feeding back the output signal of the delay-time variable filter 3 to this filter by inverting the phase of the signal like an inverter circuit, in the positive feedback loop circuit.

On the other hand, when the delay-time variable filter 3 used has a characteristic that the output signal is in phase with the input signal, there may be used a circuit for feeding back the output signal of the delay-time variable filter 3 to this filter by keeping the phase of the signal, in the positive feedback loop circuit.

According to the VCO of the above construction, an output signal of the delay-time variable filter 3 that controls the delay time of an input signal according to the control signal input is changed into a binary pulse signal. This binary pulse signal is positively fed back to the input side of the delay-time variable filter 3 at a desired level. Therefore, it is not necessary to provide an AGC circuit at the output side of the filter 3. As a result, it is possible to simplify the construction of the VCO unlike the conventional VCO that requires the AGC circuit. Thus, the VCO can be provided on an LSI, which makes it possible to provide a low-cost product.

Figure 3:
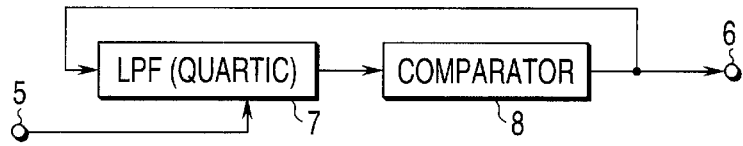
FIG. 3 is a block diagram showing a first embodiment of the VCO shown in FIG. 2.

FIG. 3 shows a first embodiment of the VCO shown in FIG. 2.

In the VCO shown in FIG. 3, a quartic Butterworth low-pass filter (LPF) 7, for example, is used as the delay-time variable filter. The output side of the low-pass filter is connected to a voltage comparator circuit (comparator) 8 for changing an input signal into a binary signal and outputting a binary pulse signal of a desired amplitude to a positive feedback loop circuit. The output side of the comparator 8 is connected to the input of the LPF 7 in a loop so that the output pulse signal from the comparator 8 is positively fed back to the LPF 7. An output resistance of the voltage comparator circuit 8 is set to a value at which an output pulse signal of the voltage comparator circuit 8 becomes an optimum value corresponding to the performance characteristic of the filter 3. The LPF 7 has a characteristic that the phase of an output signal becomes inverse to the phase of the input signal in the cutoff frequency. Therefore, the comparator 8 which has a function of phase inversion in carrying out a positive feedback is used. A reference number 5 denotes a control input node, and 6 denotes a signal output node.

The operation of the VCO shown in FIG. 3 will be explained next.

The LPF 7 changes the cutoff frequency according to the control signal (a control voltage in the present example) from the control input node 5, thereby to change the delay time accordingly, and outputs the delayed signal. The comparator 8 changes the signal output from the LPF 7 into a binary signal, and outputs the binary pulse signal to the signal output node 6. The output signal of the comparator 8 is positively fed back to the LPF 7 as an input signal to the LPF 7. Therefore, an oscillation occurs. A higher-harmonic component included in the output signal (pulse signal) of the comparator 8 positively fed back to the LPF 7 as the input signal is removed by the LPF 7. As a result, the comparator 8 accurately compares the voltage with the output signal (sinusoidal wave signal).

In FIG. 3, the VCO has the oscillation frequency that has a period of two times the time delayed by the LPF 7. This oscillation frequency changes according to the control voltage from the control input node 5.

As the quartic LPF 7 shown in FIG. 3, two divided LPFs of every secondary LPF may be connected in cascade. The two LPFs have transfer functions H1 and H2 as given by the following expressions (1) and (2).

$$H1=1/(S^2+1.8478S+1) \quad (H1)$$

$$H2=1/(S^2+0.7654S+1) \quad (H2)$$

In the above expressions, S represents a Laplace operator.

Figure 4A:
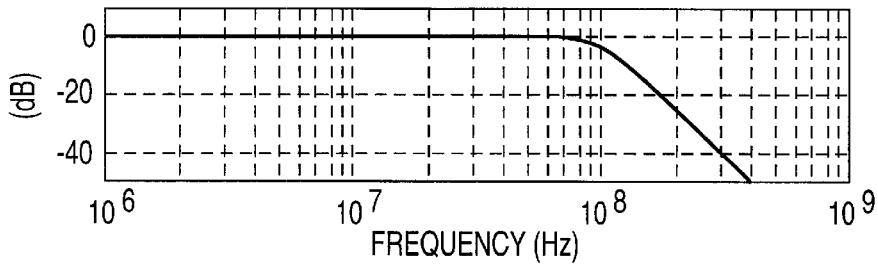
FIGS. 4A to 4C are characteristic diagrams showing one example of frequency versus amplitude characteristics, frequency versus phase characteristics, and frequency versus delay characteristics (relative delay characteristics) of an LPF shown in FIG. 3 respectively.
Figure 4B:
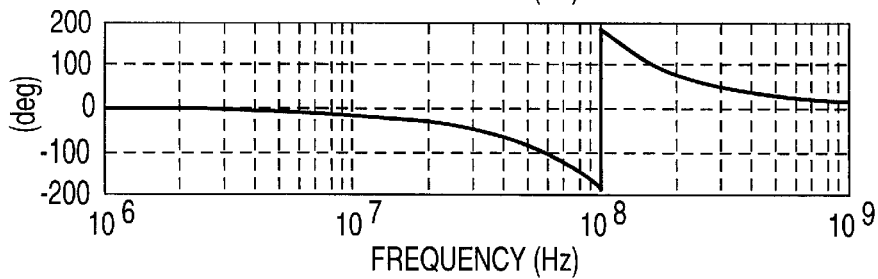
Figure 4C:
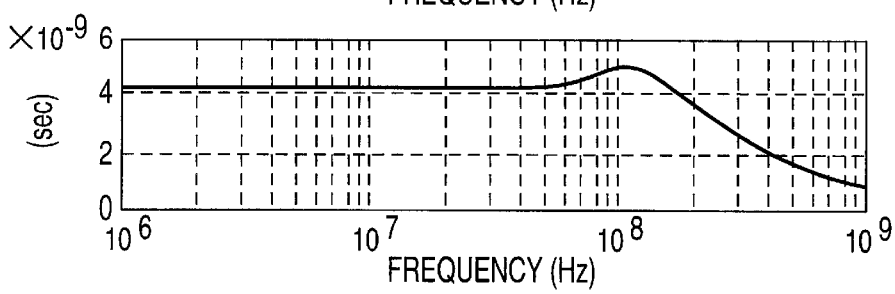

FIGS. 4A to 4C show one example of output characteristics of the LPF 7 shown in FIG. 3.

FIG. 4A shows amplitude characteristics of the LPF 7, where the cutoff frequency (3 dB attenuation point) is set to 100 MHz.

FIG. 4B shows phase characteristics of the LPF 7, where the phase is shifted by 180 degrees in the cutoff frequency 100 MHz.

FIG. 4C shows delay characteristics (relative delay characteristics) of the LPF 7, where a delay of 5 nanosecond (nS) occurred in the cutoff frequency 100 MHz.

When the LPF 7 shown in FIG. 3 is set to have characteristics as shown in FIGS. 4A to 4C, that is, when the cutoff frequency is set to the frequency of a phase shift of 180 degrees, the VCO shown in FIG. 3 oscillates in the frequency of 100 MHz that coincides with the cutoff frequency.

For the LPF 7, the frequency of a signal phase shift of 180 degrees does not need to exactly coincide with the cutoff frequency. The cutoff frequency may be set to within a suitable range with a negligible level of deviation. For example, the cutoff frequency is set to within a range of 0.5 to 2 times the frequency in which the signal phase shifts by 180 degrees.

The VCO of the present invention is characterized in utilizing delay characteristics of a delay-time variable filter. Types and degrees of the delay-time variable filter are not limited.

By comparing voltages at a later stage of the delay-time variable filter as shown in FIG. 3, there is an advantage that a positive feedback can be done by cutting off noise between the input and output of the voltage comparator circuit.

In order to minimize a distortion in the output waveform of the delay-time variable filter for executing an accurate comparison of voltages, it is preferable to arrange as follows. The delay-time variable filter has frequency characteristics capable of sufficiently suppressing the component of tertiary higher harmonics or above in the input signal (pulse signal) of the delay-time variable filter, thereby passing only the fundamental frequency component of the input signal.

The following is one example of the delay-time variable filter. When a quartic Butterworth filter is used that has a cutoff frequency of near 1.5 times the frequency of the input signal (pulse signal), the rate of the amplitude of the fundamental frequency component to the amplitude of the tertiary higher harmonics becomes 30 dB or above. Thus, the output can be regarded as almost only the fundamental frequency component.

FIG. 5A shows one detailed example of a circuit construction of the VCO shown in FIG. 3.

In FIG. 5A, a reference number 10 denotes a control input node, and 9 denotes a differential output node for outputting a differential clock signal.

A quartic LPF 7 has two secondary LPFs LPF1 and LPF2 in cascade connection. These secondary LPFs are constructed of bipolar transistors, resistors and capacitors respectively, for example.

The secondary LPF LPF1 at a pre-stage consists of seven npn transistors Q1 to Q7, two capacitors C1 and C2, and one resistor R1.

In other words, the transistor Q2 has a collector and a base mutually connected to each other, and has the collector connected to a node of a power source potential (VCC). The transistor Q1 has a collector connected to an emitter of the transistor Q2.

The transistor Q6 has a collector and a base mutually connected to each other, and has the collector connected to the VCC node, with an emitter connected to a base of the transistor Q1. The transistor Q7 has a collector connected to an emitter of the transistor Q2, with bases and collectors connected in cross to the transistor Q1. The capacitor C1 is connected to between emitters of the transistors Q1 and Q7, and the capacitor C2 is connected to between connectors of the transistors Q1 and Q7.

The input transistors Q3 and Q5 forming a differential pair have their collectors connected to the emitters of the transistors Q1 and Q7 respectively.

One transistor Q4 for a current source and the resistor R1 are connected in series between an emitter-common connected node of the input transistors Q3 and Q5 and a ground potential (GND). The input transistors Q3 and Q5 have differential feedback input signals Vin− and Vin+ applied to their respective bases, with differential output signals taken out from their respective collectors. A base of the one transistor Q4 for the current source is connected to a control input node 10.

In the above construction, the differential feedback input signals Vin− and Vin+ are applied to the bases of the input transistors Q3 and Q5, and differential output signals are taken out from their respective collectors.

In the present embodiment, the capacitor C1 is directly connected to between the emitters of the transistors Q1 and Q7. However, the circuit construction is not limited to this, and the capacitor C1 may be substantially connected to between the emitters. Further, in the present embodiment, the capacitor C2 is directly connected to between the collectors of the transistors Q1 and Q7. However, the circuit construction is not limited to this, and the capacitor C2 may be substantially connected to between the collectors.

In the LPF LPF1 shown in FIG. 5A, a diode D1 may be used instead of the transistor Q2, and a diode D2 may be used instead of the transistor Q6, as shown in FIG. 5B.

The secondary LPF LPF2 at the next stage consists of six npn transistors Q8 to Q13, two capacitors C3 and C4, and two resistors R2 and R3.

In other words, the transistors Q9 and Q11 have their collectors connected to the VCC node respectively. The transistor Q8 has a collector connected to an emitter of the transistor Q9, with a base connected to an emitter of the transistor Q11. The transistor Q12 has a collector connected to the emitter of the transistor Q11, with mutual bases and collectors connected in cross to the transistor Q8.

The capacitor C3 is connected to between emitters of the transistors Q8 and Q12, and the capacitor C4 is connected to between connectors of the transistors Q8 and Q12.

One transistor Q10 for a current source and the resistor R2 are connected in series between the emitter of the transistor Q8 and a GND node. One transistor Q13 for a current source and the resistor R3 are connected in series between the emitter of the transistor Q12 and the GND node. Bases of the current source transistors Q10 and Q13 are connected to the control input node 10.

In the above construction, differential signals are applied from the pre-stage LPF LPF1 to the bases of the transistors Q9 and Q11, and differential output signals are taken out from emitters of the transistors Q8 and Q12.

In the present embodiment, the capacitor C3 is directly connected to between the emitters of the transistors Q8 and Q12. However, the circuit construction is not limited to this, and the capacitor C3 may be substantially connected to between the emitters. Further, in the present embodiment, the capacitor C4 is directly connected to between the collectors of the transistors Q8 and Q12. However, the circuit construction is not limited to this, and the capacitor C4 may be substantially connected to between the collectors.

The collector currents of the current source transistors Q10 and Q13 in the next-stage LPF LPF2 are set to one half of the collector current of the current source transistor Q4 in the pre-stage LPF LPF1 respectively.

According to the present embodiment, the collector currents are set equal for the pair of transistors Q1 and Q7 and the pair of transistors Q2 and Q6 in the pre-stage LPF LPF1 respectively, and for the pair of transistors Q9 and Q11 and the pair of transistors Q8 and Q12 in the next-stage LPF LPF2 respectively.

The differential output signal of the next-stage LPF LPF2 is input to a voltage comparator circuit (comparator) 8. This comparator 8 consists of a first differential amplifier DA1, a first emitter-follower circuit EF1, a second emitter-follower circuit EF2, and a second differential amplifier DA2.

The first differential amplifier DA1 consists of four npn transistors Q14 to Q17, two resistors R4 and R5, and one first constant current source I1.

This differential amplifier DA1 consists of the input transistors Q15 and Q17 that form a pair of differential amplifiers, the constant current source I1 connected between an emitter-common connected node of the input transistors Q15 and Q17 and the GND node, the resistor R4 and the transistor Q14 connected between the VCC node and a collector of one input transistor Q15, and the resistor R5 and the transistor Q16 connected between the VCC node and a collector of the other input transistor Q17.

In the above construction, bases of the transistors Q14 and Q16 are connected to a DC bias voltage (VB) node, with a differential signal input to bases of the input transistors Q15 and Q17 from the pre-stage LPF LPF2. A differential output signal taken out from collectors of the transistors Q14 and Q16 is input to the first emitter-follower circuit EF1 and the second emitter-follower circuit EF2.

The first emitter-follower circuit EF1 consists of an npn transistor Q18, an npn transistor Q19 having a collector and a base mutually connected to each other, an npn transistor Q20 having a collector and a base mutually connected to each other, and a second constant current source I2, between the VCC node and the GND node. A signal is input to the base of the transistor Q18, and a signal is output from an emitter of the transistor Q20.

The second emitter-follower circuit EF2 consists of an npn transistor 021, an npn transistor Q22 having a collector and a base mutually connected to each other, an npn transistor Q23 having a collector and a base mutually connected to each other, and a third constant current source I3 , between the VCC node and the GND node. A signal is input to the base of the transistor Q21, and a signal is output from an emitter of the transistor Q23.

Differential output signals of the first emitter-follower circuit EF1 and the second emitter-follower circuit EF2 are input to the second differential amplifier DA2.

The second differential amplifier DA2 consists of four npn transistors Q24 to Q27, two resistors R6 and R7, and one fourth constant current source I4. The second differential amplifier DA2 has a function of changing an input signal into a binary signal, and setting (limiting) the output signal amplitude to, for example, about 10 mV to 20 mV so that the LPF LPF1 and the LPF LPF2 are not saturated at the time of providing a positive feedback of the output signal to the LPFs LPF1 and LPF2.

This differential amplifier DA2 consists of the input transistors Q24 and Q27 that form a pair of differential amplifiers, the constant current source I4 connected between an emitter-common connected node of the input transistors Q24 and Q27 and the GND node, the resistors R6 and R7 having each one end connected to each node of the input transistors Q24 and Q27 and having the other ends connected in common, and the npn transistor Q25 and the npn transistor Q26 inserted in series into between the VCC node and the common-connected end of the resistors R6 and R7, with a collector and a base of the npn transistor Q25 mutually connected to each other and with a collector and a base of the npn transistor Q26 mutually connected to each other.

In the above construction, differential signals are input to bases of the input transistors Q24 and Q27 from the first emitter-follower circuit EF1 and the second emitter-follower circuit EF2 respectively, and differential output signals are taken out from collectors of the input transistors Q24 and Q27.

These differential output signals are output to the differential output terminal 9, and also become a feedback input to the pre-stage LPF LPF1.

FIG. 6 shows an equivalent circuit of the LPF LPF1 shown in FIGS. 5A and 5B.

In FIG. 6, a reference symbol Vin denotes an input signal voltage source, and VOUT denotes an output voltage. A reference symbol re1 denotes a sum of emitter resistances of Shockley of the transistors Q3 and Q5, re2 denotes a sum of emitter resistances of the transistors Q1 and Q7, and re3 denotes a sum of emitter resistances of the transistors Q2 and Q6. C1 denotes a capacity of the capacitor C1 and elements connected to this capacitor. C2 denotes a capacity of the capacitor C2 and elements connected to this capacitor, i1 denotes a current (a current source) flowing through the resistor re1, i2 denotes a current (a current source) flowing through the resistor re2, and i3 denotes a current (a current source) flowing through the capacitor C1.

A transfer function of the LPF LPF1 shown in FIGS. 5A and 5B will be obtained from the equivalent m circuit shown in FIG. 6.

The following expressions (1) to (3) are obtained from the equivalent circuit shown in FIG. 6.

$$i1 = \frac{V_{in}}{re1} = i2 + i3, \therefore i3 = \frac{V_{in}}{re1} - i2 \quad (1)$$

$$i3 \times \frac{1}{S \cdot C1} = i2 \cdot re2 - V_{out} \quad (2)$$

$$V_{out} = i2 \cdot \left( \frac{1}{S \cdot C2 + \frac{1}{re3}} \right) \quad (3)$$

When the expression (1) is substituted in the expression (2), the following expression (4) is obtained.

$$\left( \frac{V_{in}}{re1} - i2 \right) \cdot \frac{1}{S \cdot C1} = i2 \cdot re2 - V_{out} \quad (4)$$

Further, when the expression (4) is substituted in the expression (3), the following expression (5) is obtained.

$$\left( \frac{V_{in}}{re1} - i2 \right) \cdot \frac{1}{S \cdot C1} = i2 \cdot re2 - i2 \cdot \left( \frac{1}{S \cdot C2 + \frac{1}{re3}} \right) \quad (5)$$

$$i2 = \left( \frac{V_{in}}{re1} \cdot \frac{1}{S \cdot C1} \right) \Big/ \left( re2 - \frac{1}{S \cdot C2 + \frac{1}{re3}} + \frac{1}{S \cdot C1} \right)$$

Further, when the expression (5) is substituted in the expression (3), the following expression (6) is obtained.

$$V_{out} = \left( \frac{\frac{V_{in}}{re1} \cdot \frac{1}{S \cdot C1}}{re2 - \frac{1}{S \cdot C2 + \frac{1}{re3}} + \frac{1}{S \cdot C1}} \times \frac{1}{S \cdot C2 + \frac{1}{re3}} \right) \quad (6)$$

$$\frac{V_{out}}{V_{in}} = \frac{\frac{1}{S \cdot C1 \cdot re1}}{S \cdot C2 \cdot re2 + \frac{re2}{re3} - 1 + \frac{S \cdot C2 + \frac{1}{re3}}{S \cdot C1}}$$

When re2 is set equal to re3 in the expression (6), the following expression (7) is obtained.

$$\frac{V_{out}}{V_{in}} = \frac{\frac{1}{S \cdot C1 \cdot re1}}{S \cdot C2 \cdot re2 + \frac{S \cdot C2 + \frac{1}{re3}}{S \cdot C1}} \quad (7)$$

When $S \cdot C1$ is multiplied to the numerator and the denominator of the expression (7), the following expression (8) is obtained.

$$\frac{V_{out}}{V_{in}} = \frac{\frac{1}{re1}}{S^2 \cdot C1 \cdot C2 \cdot re2 + S \cdot C2 + \frac{1}{re3}} \quad (8)$$

$$= \frac{\frac{1}{C1 \cdot C2 \cdot re2 \cdot re1}}{S^2 + \frac{1}{C1 \cdot re2} S + \frac{1}{C1 \cdot C2 \cdot re2 \cdot re3}}$$

The numerator re1 of the expression (8) is modified as re1=(re2/re3)·re1 by taking into consideration re2=re3, that is, (re3/re2)=1. Then, the following expression (9) is obtained.

$$\frac{V_{out}}{V_{in}} = \frac{\frac{1}{C1 \cdot C2 \cdot re2 \cdot \frac{re2}{re3} re1}}{S^2 + \frac{1}{C1 \cdot re2} S + \frac{1}{C1 \cdot C2 \cdot re2 \cdot re3}} \quad (9)$$

When (re2/re3) is set equal to k, then the following expression (10) is obtained.

$$\frac{V_{out}}{V_{in}} = K \cdot \frac{\frac{1}{re2 \cdot re3 \cdot C1 \cdot C2}}{S^2 + \frac{1}{re2 \cdot C1} S + \frac{1}{re2 \cdot re3 \cdot C1 \cdot C2}} \quad (10)$$

$$K = \frac{re2}{re3}$$

In the above expression (10), S represents a Laplace operator. From the transfer function of the expression (10), it can be known that the circuit characteristic of the LPF LPF1 in FIG. 5 has a secondary transfer function.

From the following general expression (11) of the transfer function of the filter circuit, a relationship among ω0, Q, C1 and C2 of the LPF LPF1 in FIG. 5 is obtained as shown in the expression (12).

$$\frac{V_{out}}{V_{in}} = \frac{\omega o^2}{S^2 + \frac{\omega 0}{Q}S + \omega o^2} \quad (11)$$

$$\left.\begin{array}{l} \omega o^2 = \dfrac{1}{re2 \cdot re3 \cdot C1 \cdot C2} \\[6pt] \omega o = \dfrac{1}{\sqrt{re2 \cdot re3 \cdot C1 \cdot C2}} \\[6pt] \dfrac{1}{re2 \cdot C1} = \dfrac{\omega o}{Q} \\[6pt] Q = \omega o \cdot re2 \cdot C1 = \dfrac{re2 \cdot C1}{\sqrt{re2 \cdot re3 \cdot C1 \cdot C2}} = \dfrac{C1}{\sqrt{C1 \cdot C2}} = \sqrt{\dfrac{C1}{C2}} \\[6pt] (re2 = re3) \end{array}\right\} \quad (12)$$

From the expression (12), it can be known that Q is determined by the rate of the two capacities C1 and C2.

Like the LPF LPF1, the circuit characteristic of the LPF LPF2 in FIG. 5 also has a secondary transfer function. A relationship among ω0, Q, C3 and C4 of the LPF LPF2 is obtained as shown in the expression (13).

$$\left.\begin{array}{l} \omega o^2 = \dfrac{1}{re2 \cdot re3 \cdot C3 \cdot C4} \\[6pt] \omega o = \dfrac{1}{\sqrt{re2 \cdot re3 \cdot C3 \cdot C4}} \\[6pt] \dfrac{1}{re2 \cdot C3} = \dfrac{\omega o}{Q} \\[6pt] Q = \omega o \cdot re2 \cdot C3 = \dfrac{re2 \cdot C3}{\sqrt{re2 \cdot re3 \cdot C3 \cdot C4}} = \dfrac{C1}{\sqrt{C3 \cdot C4}} = \sqrt{\dfrac{C3}{C4}} \\[6pt] (re2 = re3) \end{array}\right\} \quad (13)$$

As is clear from the above expressions (12) and (13), the cutoff frequency fc of the quartic LPF 7 shown in FIG. 3 is inversely proportional to re. Therefore, it is possible to control the cutoff frequency fc of the quartic LPF 7 by controlling the potential of the control input terminal 10 and by controlling the current flowing through the current source transistors Q4, Q10 and Q13. The cutoff frequency fc is proportional to the current flowing through the transistors Q4, Q10 and Q13.

The secondary LPFs LPF1 and LPF2 use small number of elements with low power consumption. Thus, they are suitable for a fine-signal processing.

FIG. 7 shows a block construction of the PLL of the present invention. The above-described VCO is used as a part of the PLL.

In the PLL shown in FIG. 7, a reference number 11 denotes a clock input terminal for inputting a reference clock, 12 denotes a control signal output terminal for outputting a control signal of a VCO 17, and 13 denotes a clock output terminal for outputting an output clock signal of the PLL.

A reference number 14 denotes a phase comparator for comparing the phase of a reference clock signal supplied from the clock input terminal 11 to a first input terminal and the phase of an output clock signal supplied from the VCO 17 to a second input terminal, and for outputting a difference between the phases (a phase difference signal).

A reference number 15 denotes a charge pump for inputting a phase difference signal output from the phase comparator 14, converting the phase difference signal into a current value (or a voltage value) signal, and outputting this signal. A reference number 16 denotes a loop filter for inputting a current value (or a voltage value) signal output from the charge pump 15, removing a higher harmonic component from this signal, converting this signal into a voltage value (a control signal), and outputting this converted signal to the control signal output terminal 12. This loop filter 16 is constructed of a primary LPF.

A reference number 17 denotes a VCO. A control input terminal of the VCO 17 is connected to the output terminal of the loop filter 16, and an output terminal of the VCO 17 is connected to the second input terminal of the phase comparator 14 and the clock output terminal 13.

The VCO 17 has a function of changing the frequency according to a control signal level input from the loop filter 16. For example, the VCO 17 increases the frequency when the control input level is high, and lowers the frequency when the control input level is low.

The PLL of the above-described construction has a negative feedback loop formed for the phase of the reference clock input from the clock input terminal 11. The PLL operates so that the phase of the output clock signal of the VCO 17 coincides with the phase of the reference clock.

The VCO 17 of the present invention built into the loop of the PLL utilizes a delay time of the LPF. Therefore, the oscillation frequency is not easily affected by a variation in the signal amplitude. As a result, the PLL shown in FIG. 7 can output a stable frequency against crosstalk noise.

FIG. 8 shows a block construction of a signal processing circuit to be used for an information storage device, a communication device, etc. The PLL circuit relating to the above second embodiment is used to have a link with the active filter of this signal processing circuit.

Like the PLL circuit shown in FIG. 7, the PLL circuit shown in FIG. 8 consists of a clock input terminal 11, a phase comparator 14, a charge pump 15, a loop filter 16, a VCO 17, and a clock output terminal 13.

A reference number 21 denotes a reproduction signal input terminal to which an analog signal reproduced by the information storage device is input. A reference number 23 denotes an active filter for equalizing the input analog signal into a signal of a desired waveform and outputting the equalized signal to a reproduction signal output terminal 22.

In the information storage device, it is general that the active filter 23 can vary the cutoff frequency. For example, in the hard disk driving unit, a data transfer speed on the inner peripheral side of a recording medium (a disk) is different from a data transfer speed on the outer peripheral side. A frequency spectrum of a reproduction signal when the signal is reproduced on the inner periphery of the recording medium is different from a frequency spectrum of a reproduction signal when the signal is reproduced on the outer periphery of the recording medium. Therefore, it is necessary to optimize the active filter according to this change in the frequency spectrum.

The present embodiment has an object of equalizing the analog signal input from the reproduction signal input terminal 21 to an optimum level, by automatically changing the cutoff frequency of the active filter according to a change in the frequency spectrum of the reproduction signal.

The process of the operation for achieving the above object will be explained next.

Referring to FIG. 8, the VCO 17 utilizes a delay time of the LPF as described above with reference to FIG. 3. The cutoff frequency fc of the LPF coincides with the oscillation frequency of the VCO 17 or is proportional to this frequency as described above. The cutoff frequency fc of the LPF is also proportional to an input voltage to the VCO 17.

In FIG. 8, when the PLL circuit is in a phase-synchronized steady state, the frequency of the reference clock input of the clock input terminal 11 coincides with the frequency of the clock output of the clock output terminal 13.

Assume that fi represents a frequency of the reference clock input, fo represents a frequency of the clock output, Vi represents a control input voltage of the VCO 17, and fc represents a cutoff frequency of the LPF in the VCO 17. Then, a relationship shown in the following expression is established.

$$fi=fo=a\cdot fc=b\cdot Vi \text{ (where a and b are proportional constants)} \quad (14)$$

When the control input voltage Vi of the VCO 17 is used as a control signal for setting the cutoff frequency of the active filter 23, it is possible to achieve the following. That is, the cutoff frequency fca of the active filter 23 coincides with or is proportional to the frequency fi of the reference clock input. Then, a relationship shown in the following expression is established.

$$fi=fca \text{ or } fi=c\cdot fca \text{ (where c is a proportional constant)} \quad (15)$$

In other words, in the PLL circuit shown in FIG. 8, the control signal input of the VCO 17 is in a proportional relationship with the oscillation a frequency of the VCO 17. When this control signal input is used as a control signal for controlling the cutoff frequency of the active filter 23, the cutoff frequency of the active filter 23 can be set proportional to the oscillation frequency of the PLL circuit (or the input clock frequency of the PLL circuit).

This proportional relationship is extremely effective for realizing the signal processing circuit of the present invention in an integrated circuit. This will be explained next.

When a capacitor is formed in an integrated circuit chip, a capacity varies by about 10%, for example, from a target value due to a change in conditions of a manufacturing process. This means that it is not possible to accurately set the cutoff frequency fca of the active filter 23.

In the signal processing circuit of the present invention, the capacitors of the LPFs (for example, LPF LPF1 and LPF LPF2) in the VCO 17 and the capacitors used in the active filter 23 are formed on the same chip. Thus, a variation in an absolute value of the capacity of the capacitors is linked to the operation of the PLL, thereby solving the above problem.

With this arrangement, it is possible to cancel the performance deterioration in the integrated circuit attributable to the variance in the capacity of the capacitors or the performance deterioration in a device using this integrated circuit.

The VCO 17 of the present embodiment explained with reference to FIG. 8 has the oscillation circuit constructed by connecting the LPF 7 and the comparator 8 in a feedback loop as explained above with reference to FIG. 3. Thus, the oscillation frequency of the VCO 17 is determined one-sidedly by the phase characteristics of the LPF, as described above.

However, the oscillation frequency of the VCO 17 is not dependent on only the phase characteristics of the LPF in reality, and is also dependent on the operation speed of the transistors that constitute the LPF and comparator and a delays (delay elements) due to parasitic elements. These delay elements affect the phase characteristics of the VCO 17.

FIG. 9A is a block diagram showing construction elements relating to the delay of the VCO 17 in FIG. 8. This delay is expressed by transfer functions as shown in FIG. 9B.

In FIG. 9A, 31 denotes a control input terminal of the VCO, 32 denotes an LPF, and 33 denotes an undesirable delay (a delay element) that is generated in addition to a genuine delay time.

In FIG. 9B, 35 and 36 denote transfer functions of delay times corresponding to the LPF 32 and the undesirable delay 33 in FIG. 9A.

FIGS. 10A to 10C show one example of frequency characteristics of the undesirable delay time (hereinafter to be referred to as a parasitic delay) in FIG. 9B.

In other words, FIG. 10A shows frequency versus amplitude characteristics of the parasitic delay 36, and the amplitude has a flat characteristic with respect to the frequency. FIG. 10B shows frequency versus phase characteristics when the parasitic delay 36 is assumed as 1 ns. FIG. 10C shows frequency versus delay characteristics (relative delay characteristics) of the parasitic delay 36, and the delay is flat with respect to the frequency and has 0 nS.

FIGS. 11A to 11C show frequency characteristics when the parasitic delay 36 shown in FIG. 9B is included in the oscillation loop of the VCO having the frequency characteristics shown in FIGS. 4A to 4C.

In other words, FIG. 11A shows frequency versus amplitude characteristics, in which the cutoff frequency (3 dB attenuation point) is set to 100 MHz. FIG. 11B shows frequency versus phase characteristics, in which the frequency for a phase shift of 180 degrees is set lower than the original oscillation frequency 100 MHz. FIG. 11C shows frequency versus delay characteristics (relative delay characteristics), in at which a delay of about 0.6 nS has occurred in the frequency 100 MHz.

Therefore, when the parasitic delay 36 exists, there occurs a deviation between the cutoff frequency of the active filter 23 shown in FIG. 8 and the cutoff frequency of the LPF as a part of the VCO 17. Thus, there arises an inconvenience that it is not possible to precisely control the cutoff frequency of the active filter 23. An embodiment for canceling this inconvenience will be explained next.

Figure 12:
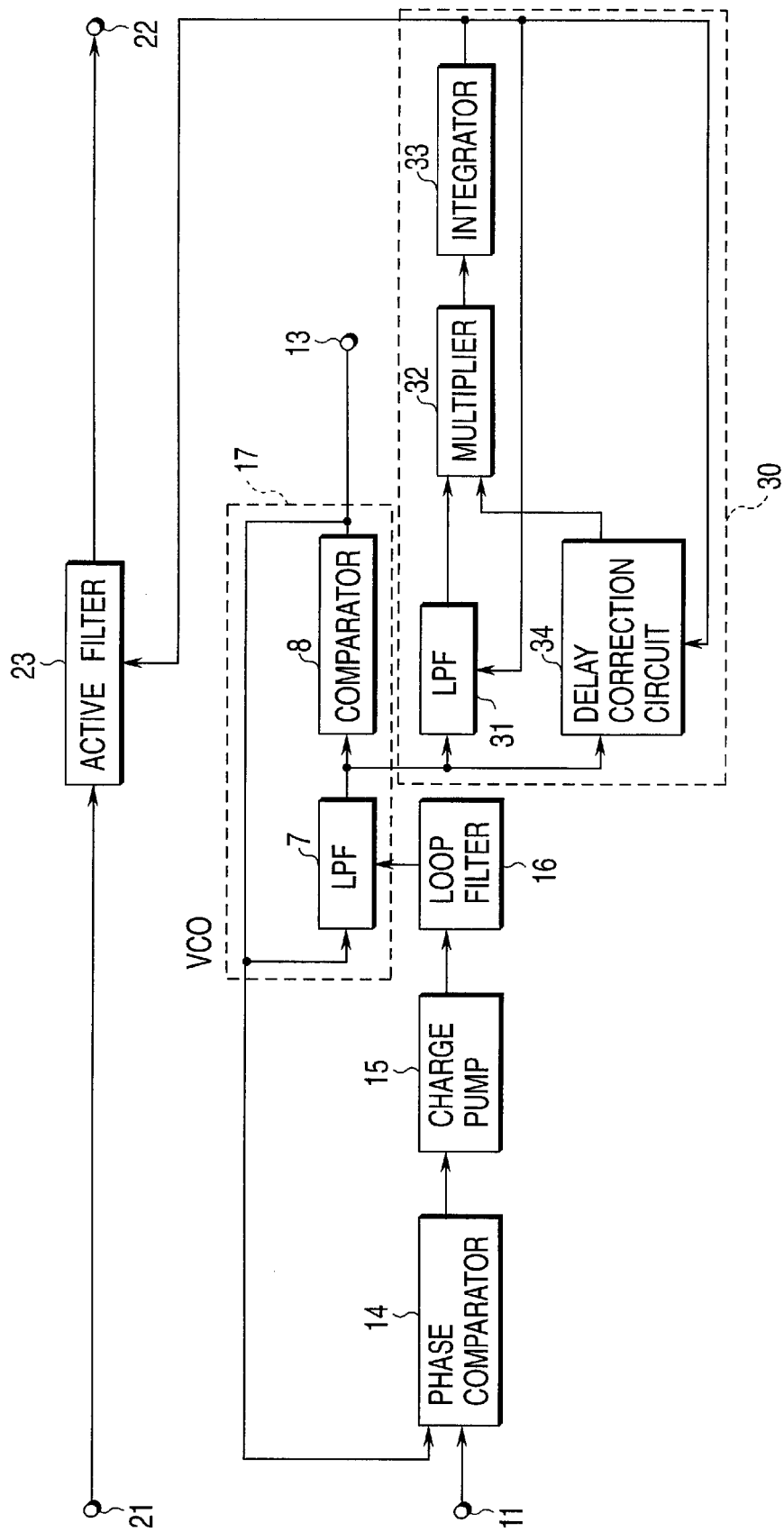
FIG. 12 is a block diagram showing a modification of the signal processing circuit shown in FIG. 8.

FIG. 12 shows a block construction of a signal processing circuit relating to a fourth embodiment of the invention.

The construction of the signal processing circuit shown in FIG. 12 is the same as the construction of the signal processing circuit of the third embodiment shown in FIG. 8 except the following. A correction circuit block 30 is inserted into between the LPF 7 of the VCO 17 and the active filter 23. Further, an output of the correction circuit block 30 is used instead of the control signal input of the VCO 17 as a control signal for controlling the cutoff frequency of the active filter 23. Portions same as those in FIG. 8 are attached with like reference numbers.

Like the signal processing circuit shown in FIG. 8, the signal processing circuit shown in FIG. 12 includes a reproduction signal input terminal 21, an active filter 23, a reproduction signal output terminal 22, a clock input terminal 11, a clock output terminal 13, a phase comparator 14, a charge pump 15, a loop filter 16, and a VCO 17.

When a reference clock has been input to the clock input terminal 11, the phase comparator 14 compares a phase of the reference clock with a phase of the clock applied from the VCO 17. The charge pump 15 converts a phase difference signal obtained as a result of the comparison into a current or a voltage. The loop filter 16 removes a higher harmonic component included in an output of the charge pump 15, and then supplies this output to the VCO 17.

The VCO 17 includes an LPF 7 and a comparator 8 formed in a loop. The oscillation frequency changes according to a current or a voltage supplied from the loop filter 16. An output of the VCO 17 is applied to the other input terminal of the phase comparator 15, and a phase of the output of the VCO 17 and a phase of the reference clock are controlled to be synchronized with each other (coincide). An output of the LPF 7 within the VCO 17 is applied to the comparator 8 and is also applied to the correction circuit block 30.

In the present embodiment, the oscillation frequency of the VCO 17 is assumed as 100 MHz. In the VCO 17, an input signal of the LPF 7 is in a rectangular waveform of which amplitude has been limited by the comparator 8. An output signal of the LPF 7 is in a waveform close to a sinusoidal waveform as can be estimated from the characteristics shown in FIG. 4A.

The correction circuit block 30 shown in FIG. 12 will be explained next.

The correction circuit block 30 has a role of outputting correct information (a current or a voltage) proportional to the frequency of an input signal (the output of the LPF 7 in the VCO 17). The correction circuit block 30 has a feedback loop formed by an LPF 31, a multiplier 32, an integrator 33 and a delay correction circuit 34.

An output signal of the LPF 7 in the VCO 17 is input to the LPF 31 and the delay correction circuit 34. An output of the LPF 31 and an output of the delay correction circuit 34 are supplied to the multiplier 32. The multiplier 32 consists of, for example, a synchronous detector circuit. Signals (an output of the LPF 31 and an output of the delay correction circuit 34) of different phases in the same frequency are input to two input terminals of the multiplier 32. The integrator 33 integrates a signal supplied from the multiplier 32, and outputs an integrated result as a voltage or a current. The output is used as a control current source for the LPF 31 and the delay correction circuit 34.

The delay correction circuit 34 is for faithfully generating a genuine circuit delay other than a delay of the filter in the delay time by the LPF 31. However, when a value of the circuit delay is negligible, this delay correction circuit 34 may be omitted, and an output signal of the LPF 7 may be input to the multiplier 32.

The LPF 31 is for changing the phase of the output signal from the phase of the input signal. Instead of the LPF 31, an APF (all-pass filter), for example, may be used. An example of using the secondary Butterworth LPF is shown in this example.

Figure 13A:
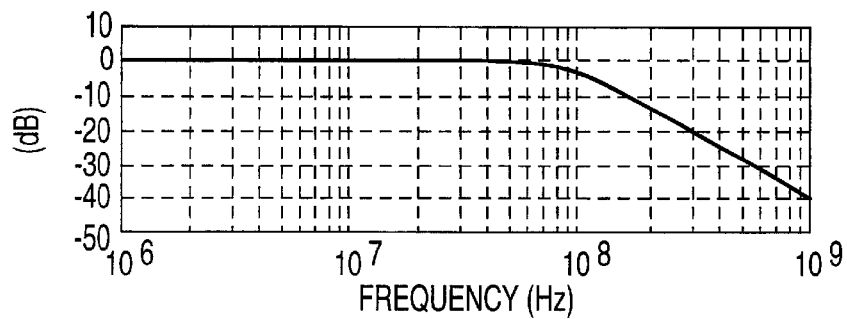
FIGS. 13A and 13B are characteristic diagrams showing one example of frequency versus amplitude characteristics and frequency versus phase characteristics of an LPF included in a correction circuit block shown in FIG. 12 respectively.
Figure 13B:
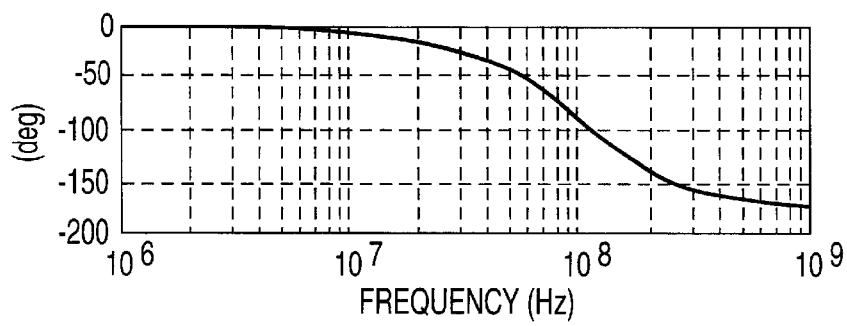

FIGS. 13A and 13B show frequency versus amplitude characteristics and frequency versus phase characteristics of the secondary Butterworth LPF 31. A phase of 90 degrees is delayed in the cutoff frequency 100 MHz.

Figure 14A:
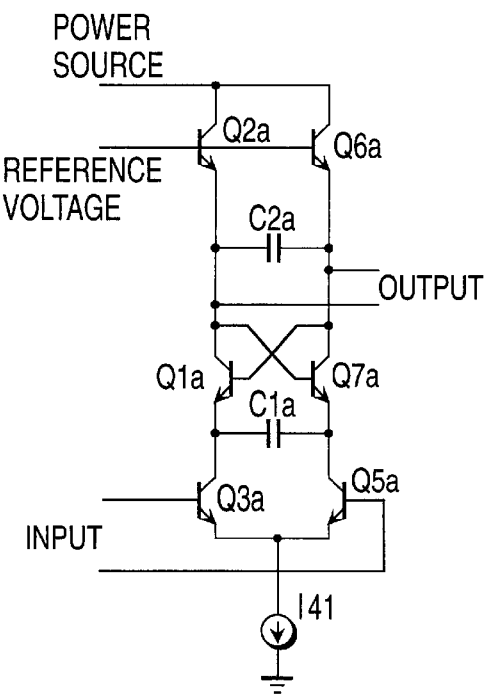
FIGS. 14A and 14B are circuit diagrams showing a detailed example of the LPF included in the correction circuit block shown in FIG. 12 respectively.

FIG. 14A shows a detailed example of a circuit construction of the secondary Butterworth LPF 31 in the correction circuit block 30.

This circuit has a construction similar to that of the LPF LPF1 shown in FIGS. 5A and 5B. Portions corresponding to those in the LPF LPF1 are attached with identical reference numbers with "a" added to the last of each reference number. A current source I41 corresponds to the transistor Q4 and the resistor R1 in the LPF LPF1. A transfer function H3 of this circuit is set as shown in the following expression (16).

$$H3=1/(s^2+1.4142s+1) \quad (16)$$

Figure 14B:
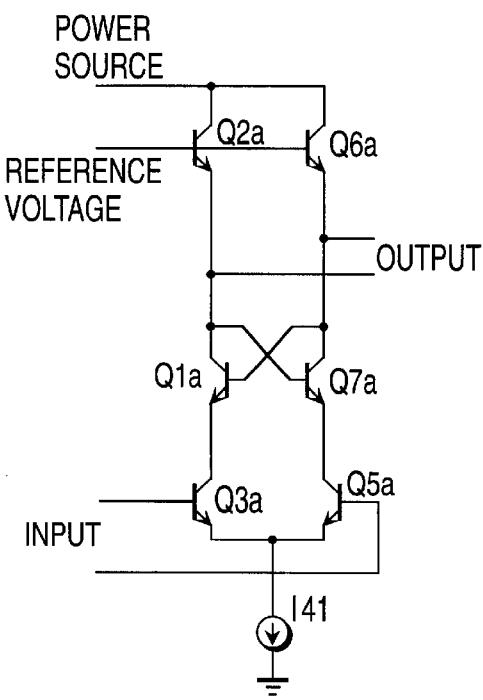

FIG. 14B shows a detailed example of a circuit construction of the delay correction circuit 34 in the correction circuit block 30 shown in FIG. 12.

This delay correction circuit 34 is different from the secondary Butterworth LPF 31 shown in FIG. 14A in that capacitors C1a and C2a have been removed. The delay time of this delay correction circuit 34 becomes a genuine circuit delay time generated due to other factors than the construction of the filter.

FIG. 15 shows a detailed example of a circuit construction of the multiplier 32 and the integrator 33 in the correction circuit block 30 shown in FIG. 12.

In a multiplier 32, a power source voltage VCC is supplied to a power source terminal 41. A first input signal is differentially input to differential input terminals 42 and 43, and a second input signal is differentially input to differential input terminals 44 and 45. The multiplier 32 then multiplies the two inputs.

Bases of npn transistors Q61 and Q62 forming a pair of differential inputs are connected to the differential input terminals 44 and 45 respectively. An emitter-common connected point of the transistors Q61 and Q62 is connected to a GND node via a current source I60.

Bases of npn transistors Q63 and Q64 forming a pair of differential inputs and bases of npn transistors Q66 and Q65 forming a pair of differential inputs are connected to the differential input terminals 42 and 43 respectively.

An emitter-common connected point of the transistors Q63 and Q64 is connected to a collector of the transistor Q61. An emitter-common connected point of the transistors Q65 and Q66 is connected to a collector of the transistor Q62.

Collectors of the transistors Q63 and Q65 are connected together to the power source terminal 41, and collectors of the transistors Q64 and Q66 are connected together to the power source terminal 41 via a current load I61.

The integrator 33 is realized by a capacitor C6 that removes a higher harmonic component of a signal supplied from the multiplier 32. The integrator 33 produces an integration output (that is, information corresponding to a phase difference between the LPF 31 and the delay correction circuit 34) from an integration output terminal 46.

FIG. 16 shows an example of waveforms of two input signals and an output signal of the multiplier 32 shown in FIG. 15. When a phase difference between the two input signals is 90 degrees, a value obtained by multiplying the output signal by the integrator 33 becomes zero. When a phase difference between the two input signals deviates from 90 degrees, a value obtained by multiplying the output signal by the integrator 33 changes according to a phase difference between the two input signals.

An integration output of the integrator 33 is supplied to the LPF 31 and the delay correction circuit 34 shown in FIG. 12. The correction circuit block 30 operates so that a phase difference between the output of the LPF 31 and the output of the delay correction circuit 34 becomes 90 degrees. Based on this adjustment, the delay correction circuit 34 faithfully generates a genuine circuit delay other than a delay due to the filter in the delay time by the LPF 31.

As explained above, the correction circuit block 30 shown in FIG. 12 operates as follows. The two inputs to the multiplier 32 (that is, the output of the LPF 31 and the output of the delay correction circuit 34) generate a phase difference of 90 degrees in a loop constructed of the LPF 31, the multiplier 32, the integrator 33 and the delay correction circuit 34.

Based on the above operation, in the signal processing circuit shown in FIG. 12, the correction circuit block 30 generates a current or a voltage according to the frequency of the output signal of the VCO 17. This current or voltage is used for a control signal for controlling the cutoff frequency of the active filter 23. Thus, it is possible to control the cutoff frequency of the active filter 23 according to the frequency of the VCO 17.

In the correction circuit block 30 of the signal processing circuit shown in FIG. 12, the frequency characteristics of the LPF 7 are controlled to be compensated for by using phase information. However, it is also possible to control to compensate for the frequency characteristics of the LPF 7 by using amplitude information. A fifth embodiment of this case will be explained next.

Figure 17:
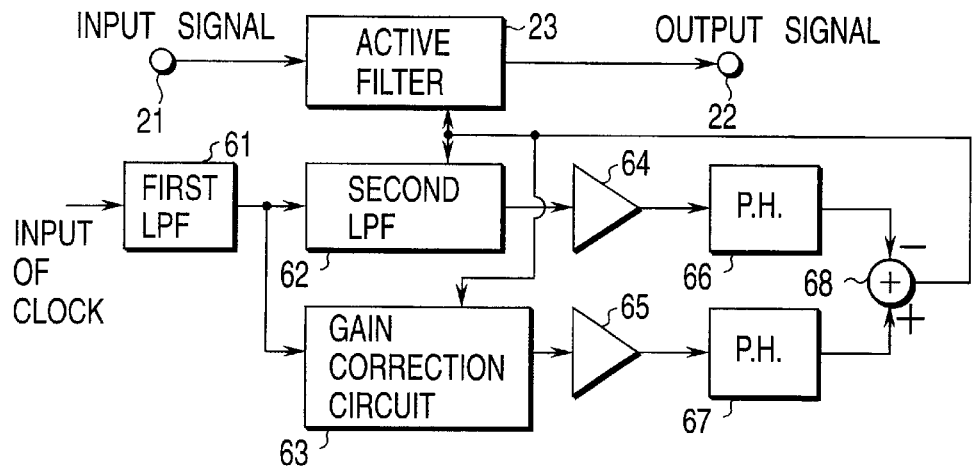
FIG. 17 is a block diagram showing a signal processing circuit relating to a fifth embodiment of the present invention.

FIG. 17 shows a signal processing circuit relating to a fifth embodiment of the invention.

In the signal processing circuit shown in FIG. 17, a reference number 21 denotes a reproduction signal input terminal to which an analog signal is input, 23 denotes an active filter, and 22 denotes a reproduction signal output terminal.

A reference number 61 denotes a first LPF for passing only a reference frequency component included in a clock signal input from a PLL or a clock signal input from an external unit. This first LPF 61 uses a quartic Butterworth filter having a cutoff frequency approximately 1.5 times the clock frequency. This is for obtaining frequency characteristics of being able to sufficiently suppress a tertiary higher harmonic or above component of a clock input when, for example, a clock signal has been input from a clock output terminal in the PLL. With this arrangement, in the output signal of the first LPF 61, the rate of the amplitude of the reference frequency component to the amplitude of the tertiary higher harmonic becomes 30 dB or above. As a result, the output can be regarded as almost only the fundamental frequency component.

It is possible to simplify the circuit construction with the following arrangement although not shown in the drawing. That is, the first LPF 61 and the comparator are connected in a loop to form a VCO like the signal processing circuit shown in FIG. 12. This VCO is built into the loop of the PLL, and an output of the loop filter in the PLL is used as a control signal input of the frequency characteristics of the first LPF 61.

A reference number 62 denotes a second LPF capable of controlling the cutoff frequency according to the control signal input. A sinusoidal waveform signal of only the reference frequency component is input to the second LPF 62 from the first LPF 61. Therefore, the amplitude of the output signal becomes the input signal amplitude applied with gain characteristics of the second LPF 62 in the clock frequency.

A reference number 63 denotes a gain correction circuit of which cutoff frequency changes according to the control signal input (linked with the second LPF 62). The gain correction circuit 63 is used for correcting a DC gain of the second LPF 62. This gain correction circuit 63 has the same construction as that of the second LPF 62, for example. The amplitude of the output signal of the gain correction circuit 63 becomes equal to the input signal amplitude multiplied by the DC gain of the second LPF 62.

Therefore, the rate of the amplitude of the output signal of the second LPF 62 to the amplitude of the output signal of the gain correction circuit 63 becomes equal to the rate of the gain characteristics of the second LPF 62 in the clock frequency to the DC gain characteristics.

An output of the second LPF 62 and an output of the gain correction circuit 63 are input to amplifiers 64 and 65 respectively. The amplifiers 64 and 65 have the same constructions, with a gain rate set to α.

Outputs of the amplifiers 64 and 65 are applied to peak-hold circuits 66 and 67. A difference signal of outputs of the peak-hold circuits 66 and 67 becomes a control signal of the second LPF 62, and the cutoff frequency of the second LPF 62 is controlled so that the difference signal becomes zero.

In this case, the amplitude characteristics (the rate of the input amplitude to the output amplitude) of the second LPF 62 in the clock input frequency are corrected automatically so as to be equal to the gain rate α of the amplifiers 64 and 65. In other words, when f0 represents a clock input frequency, H(f0) represents a gain of the second LPF 62 in the f0, and H(0) represents a DC gain of the second LPF 62, a relationship as given by the following expression (17) is obtained.

$$H(f0)/H(0)=\alpha \quad (17)$$

It is possible to realize the active filter 23 that has high-precision frequency characteristics when the following conditions are satisfied. That is, a filter of which cutoff frequency changes by keeping a link with the second LPF 62 is used as the active filter 23. The active filter 23 is controlled to obtain a predetermined characteristic when the second LPF 62 satisfies the above expression (17).

In other words, according to the signal processing circuit shown in FIG. 17, it is possible to realize the active filter 23 that has high-precision frequency characteristics by the following arrangement. That is, the cutoff frequency of the second LPF 62 is controlled so that the rate of the input amplitude to the output amplitude of the second LPF 62 becomes the predetermined amplitude rate α.

Figure 18:
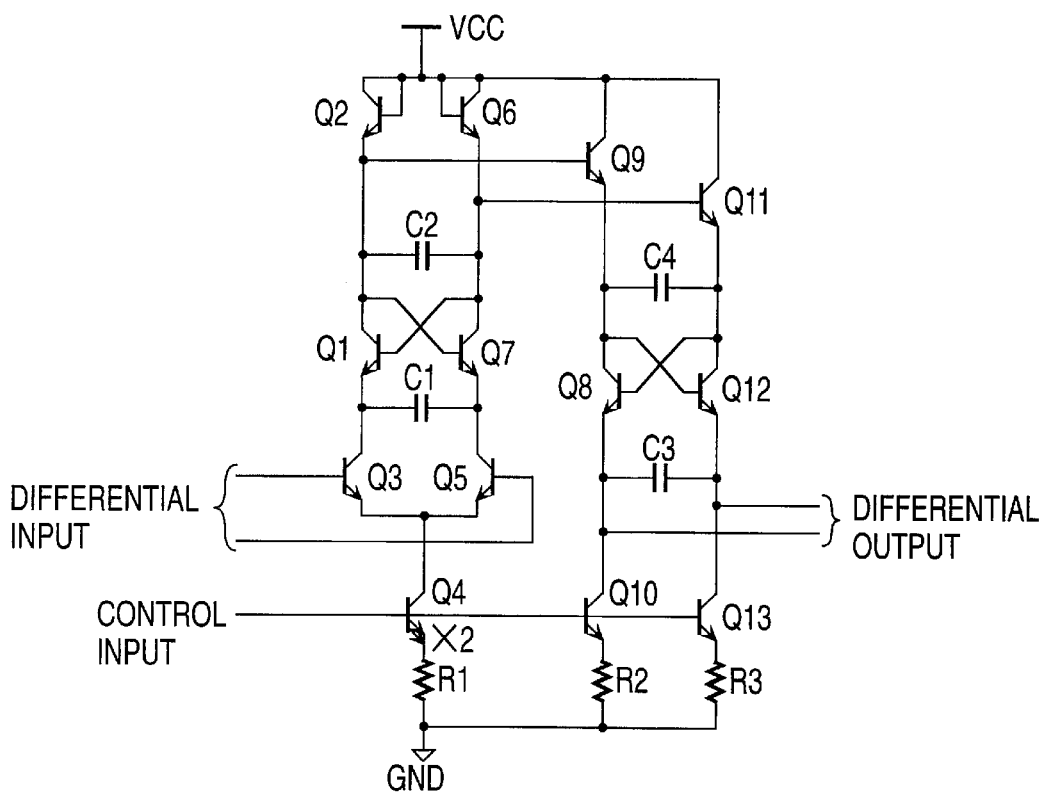
FIG. 18 is a circuit diagram showing a detailed example of a second LPF shown in FIG. 17.

As a detailed example of the second LPF 62 shown in FIG. 17, it is possible to use almost the same construction as that of the quartic Butterworth LPF having the secondary LPFs LPF1 and LPF2 shown in FIG. 5A connected in cascade as shown in FIG. 18. In FIG. 18, portions corresponding to those in FIG. 5A are attached with identical reference numbers.

The cutoff frequency fc of the quartic Butterworth LPF is inversely proportional to the emitter resistance sum re as described in the above expressions (12) and (13). Therefore, it is possible to control the cutoff frequency fc of the quartic Butterworth LPF by controlling the current that flows through the transistors Q4, Q10 and Q13 shown in FIG. 18 based on the control of the potential of the control signal input. Thus, the cutoff frequency fc becomes proportional to the current that flows through the transistors Q4, Q10 and Q13.

Figure 19:
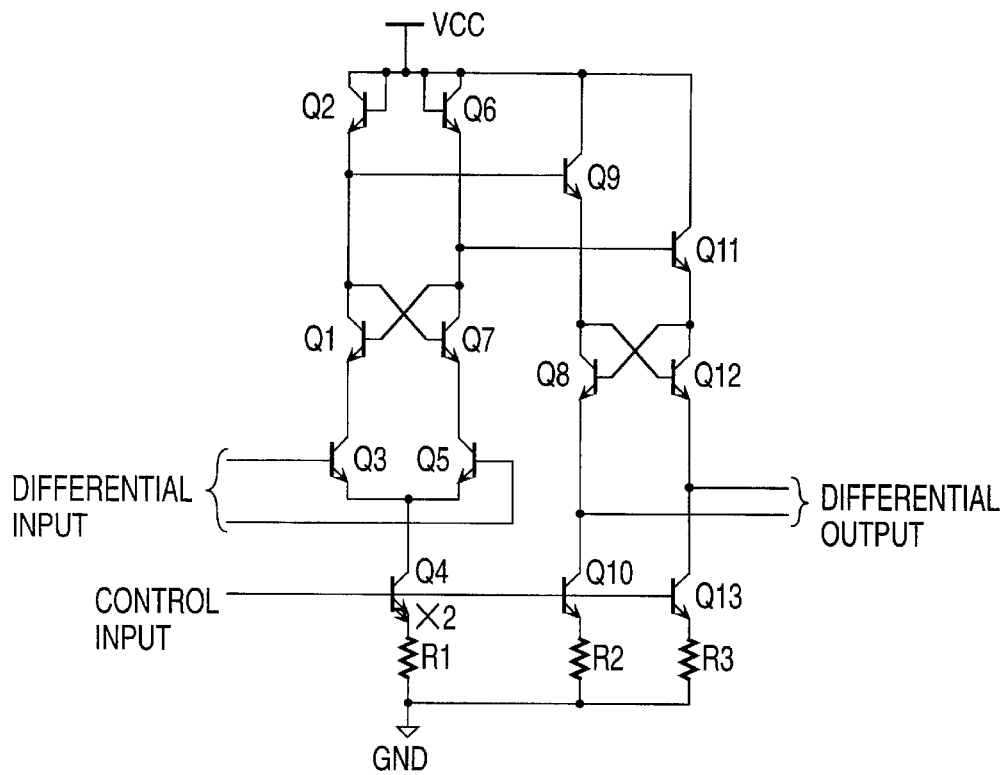
FIG. 19 is a circuit diagram showing a detailed example of a gain correction circuit shown in FIG. 17.

FIG. 19 shows a detailed example of a construction of the gain correction circuit 63 shown in FIG. 17.

The construction of the gain correction circuit 63 is equal to the construction of the quartic Butterworth LPF shown in FIG. 18 from which capacitors C1, C2, C3 and C4 have been removed. In a strict sense, this gain correction circuit 63 becomes a low-pass filter by the influence of the parasitic capacity. However, this cutoff frequency is sufficiently high, and the gain characteristics in the clock input frequency can be regarded as gain characteristics in a DC. The DC gain characteristics are approximately equal to the DC gain characteristics of the second LPF 62.

Figure 20:
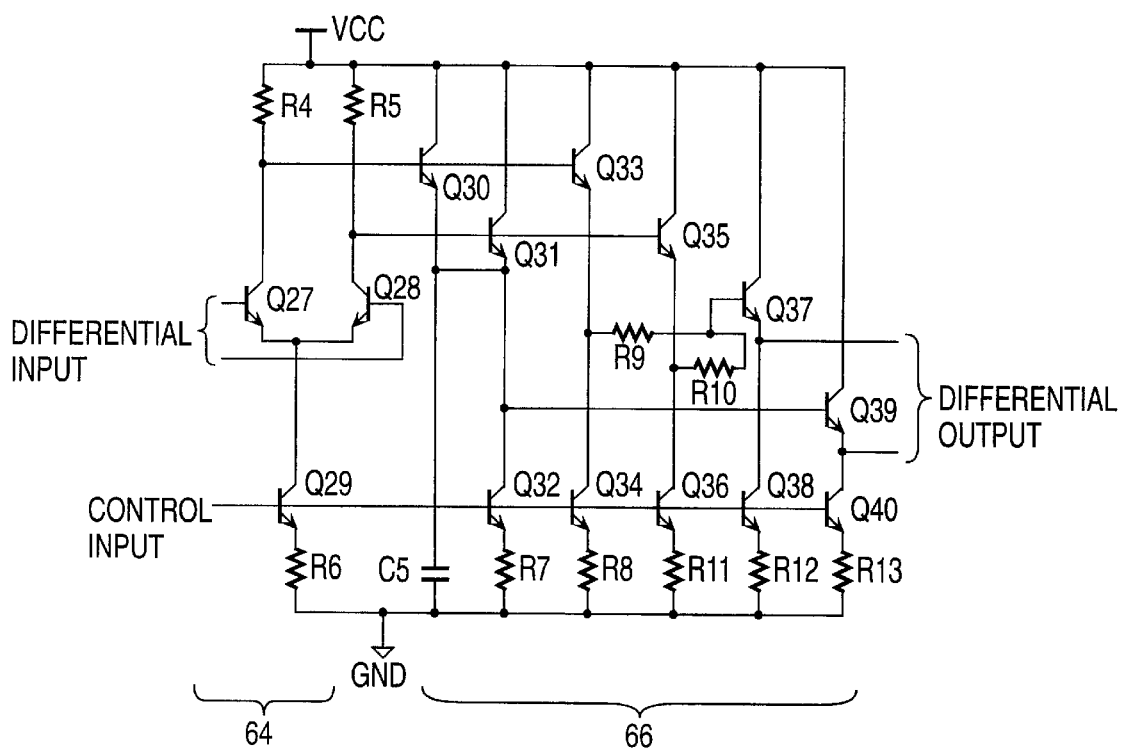
FIG. 20 is a circuit diagram showing a detailed example of an amplifier and a peak-hold circuit shown in FIG. 17.

FIG. 20 shows a detailed example of the amplifier C3 64 and the peak-hold circuit 66 at a latter stage of the second LPF 62 shown in FIG. 17.

The amplifier 64 consists of npn transistors Q27 and Q28 forming a differential input pair, an npn transistor Q29 for a current source, and resistors R4, R5 and R6. A differential output signal of an LPF is input to bases of the differential input pair of transistors Q27 and Q28 via a differential input terminal, and a differential amplification output is obtained from their collectors.

The peak-hold circuit 66 consists of npn transistors Q30 to Q40, resistors R7 to R13, and a capacitor C5. A base bias same as that of the current source transistor Q29 is being applied to current source transistors Q32, Q34, Q36, Q38 and Q40.

In the peak-hold circuit 66, emitters of the transistors Q30 and Q31 are connected in common. The current source transistor Q32 and the resistor R7 are connected between the emitter-common connected node and a GND node, thereby to construct a wired OR circuit. A capacitor C5 connected between the emitter-common connected node and the GND node keeps a potential to hold a maximum output value of the amplifier 64.

An emitter follower circuit consisting of the transistors Q33 and Q34 and the resistor R8 and an emitter follower circuit consisting of the transistors Q35 and Q36 and the resistor R11 are connected to a differential output node of the amplifier 64. Resistors R9 and R10 are connected in series between the emitters of the transistors Q33 and Q35. An intermediate point of the resistors Q9 and Q10 outputs a center value of an output amplitude of the amplifier 64.

Therefore, a potential difference between the emitter potential of the transistors Q30 and Q31 and the intermediate potential of the resistors R9 and R10 is a DC value of one half of the output amplitude of the amplifier 64. The intermediate potential of the resistors R9 and R10 is output through an emitter follower circuit consisting of transistors Q37 and Q38 and a resistor R12. The emitter potential of the transistors Q30 and Q31 is output through an emitter follower circuit consisting of transistors Q39 and Q40 and a resistor R13. Outputs (differential outputs) of these emitter follower circuits become outputs (differential outputs) of the peak-hold circuit 66.

Figure 21:
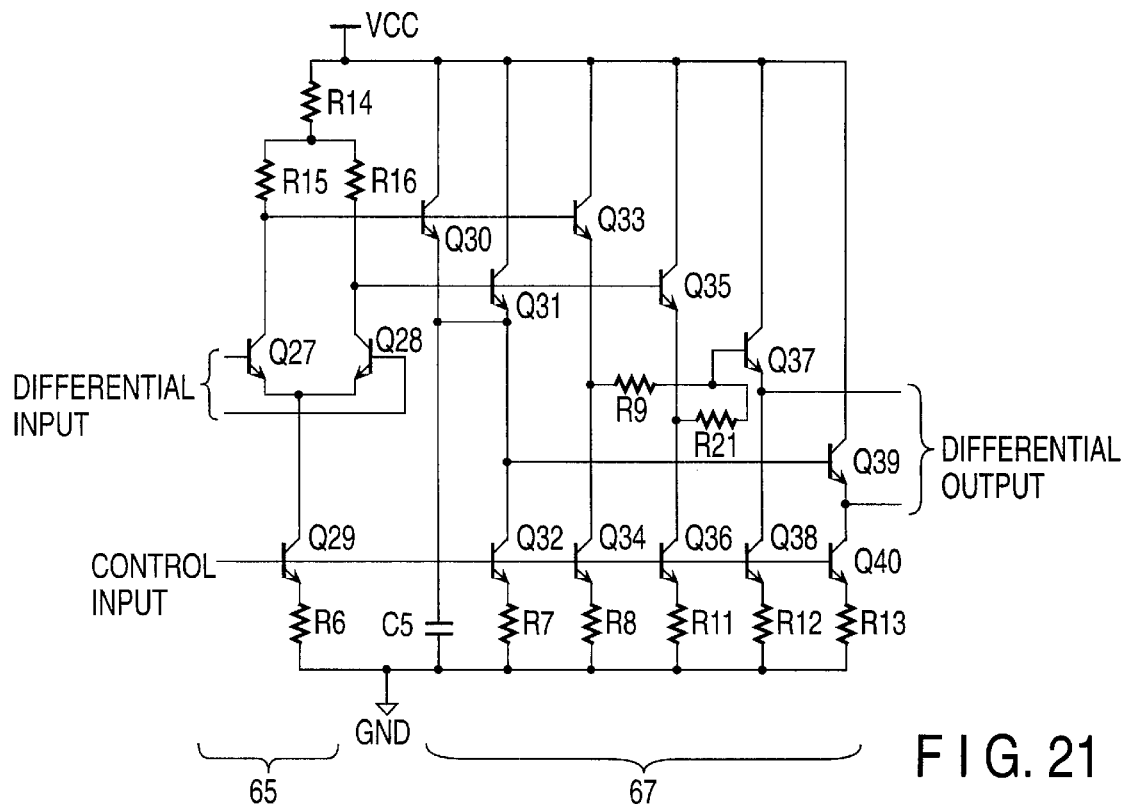
FIG. 21 is a circuit diagram showing a detailed example of other amplifier and other peak-hold circuit shown in FIG. 17.

FIG. 21 shows a detailed example of the amplifier 65 and the peak-hold circuit 67 at a latter stage of the gain correction circuit 63 shown in FIG. 17.

The amplifier 65 and the peak-hold circuit 67 are the same as the amplifier 64 and the peak-hold circuit 66 described with reference to FIG. 20 except resistors R14, R15 and R16 that are connected as loads of the amplifier 65. Like portions are attached with identical reference numbers used in FIG. 20.

When a current value of a current flowing through the current source transistor Q29 in the amplifier 64 is set equal to a current value of a current flowing through the current source transistor Q29 in the amplifier 65, a gain rate α of the amplifiers 64 and 65 is determined by a value of load resistance of the differential input pair transistors.

Assume that R represents a resistance of the load resistors R4 and R5 of the differential input pair of transistors Q27 and Q28 of the amplifier 64, and R' represents a resistance of the load resistors R15 and R16 of the differential input pair of transistors Q27 and Q28 of the amplifier 65. When the resistance of the resistor R14 is set to (R−R')/2, the gain rate a of the amplifiers 64 and 65 becomes R'/R.

Figure 22:
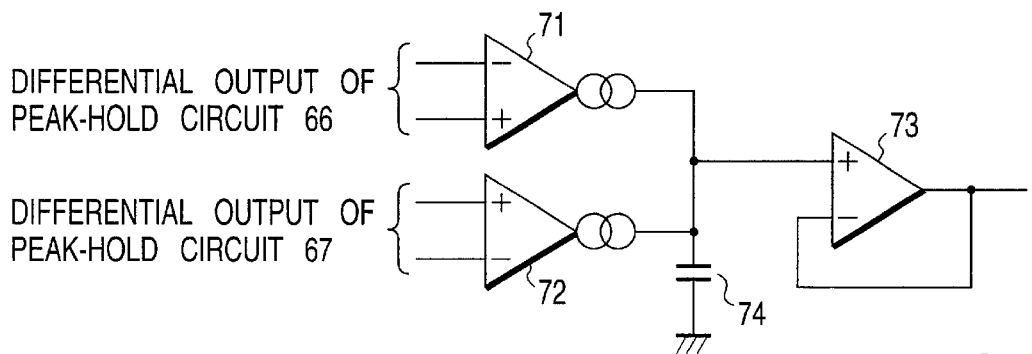
FIG. 22 is a circuit diagram showing a detailed example of an adder circuit shown in FIG. 13.

FIG. 22 shows a detailed example of an adder circuit 68 shown in FIG. 17.

This adder circuit consists of a gm amplifier 71 for receiving an input of a differential output of the peak-hold circuit 66 between an inverted input terminal (−) and a non-inverted input terminal (+), a gm amplifier 72 for receiving an input of a differential output of the peak-hold circuit 67 between a non-inverted input terminal (+) and an inverted input terminal (−), a capacitor 74 connected in common between output nodes of the gm amplifiers 71 and 72 and a GND node, and a voltage follower circuit for receiving an input of the potential of the capacitor 74. Gains of the gm amplifiers 71 and 72 are set equal to each other.

In the adder circuit of the above construction, when the output level of the peak-hold circuit 67 is higher than the output level of the peak-hold circuit 66, the current of the gm amplifier 72 becomes larger than the current of the gm amplifier 71. As a result, the capacitor 74 is charged, and the potential of the capacitor 74 increases.

On the other hand, when the output level of the peak-hold circuit 66 is higher than the output level of the peak-hold circuit 67, the current of the gm amplifier 71 becomes larger than the current of the gm amplifier 72. As a result, the capacitor 74 is discharged, and the potential of the capacitor 74 decreases.

When the output level of the peak-hold circuit 66 is equal to the output level of the peak-hold circuit 67, the current of the gm amplifier 71 becomes equal to the gm amplifier 72. As a result, no current flows through the capacitor 74, and the potential of the capacitor 74 is stabilized at a constant value.

When the potential of the capacitor 74 is input as a control signal of the second LPF 62 in FIG. 17 via the voltage follower circuit 73, a feedback is applied so that the output level of the peak-hold circuit 66 becomes equal to the output level of the peak-hold circuit 67. In other words, a feedback is applied so that the rate of the output amplitude of the second LPF 62 to the output amplitude of the gain correction circuit 63 shown in FIG. 17 becomes α. As a result, the second LPF 62 accurately has the following frequency characteristics.

$$H(f0)/H(0)=\alpha \quad (18)$$

When the control input of the second LPF 62 is used also as the control input of the filter 23 shown in FIG. 17, it becomes possible to control the frequency characteristics of the filter 23 linked to the frequency characteristics of the second LPF 62. As a result, it is possible to realize a filter having high-precision frequency characteristics that compensate for variance in the frequency characteristics due to variance in integrated circuit elements.

According to the signal processing circuit of the fifth embodiment, frequency characteristics of the filter are feedback controlled so as to obtain a predetermined value of gain characteristics in the clock signal frequency. With this arrangement, it is possible to set the cutoff frequency of the filter accurately to a specific value. As a result, it is possible to cancel aggravation in the characteristics of the active filter due to variance in the capacity of capacitors that is a drawback on the manufacturing of integrated circuits.

Figure 23:
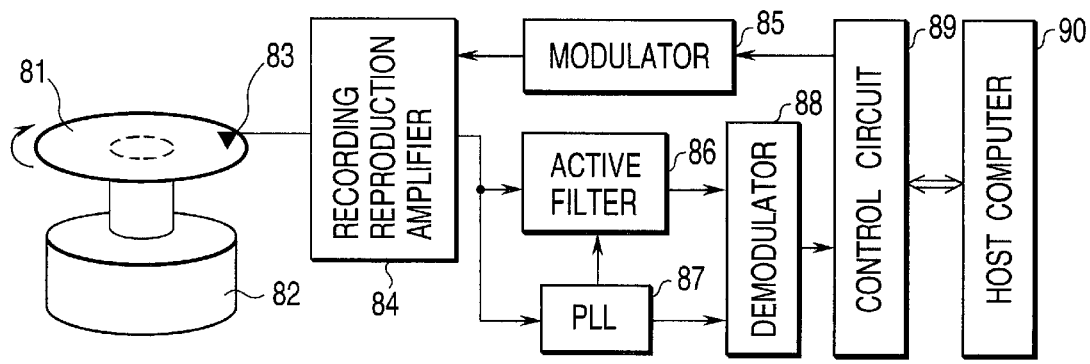
FIG. 23 is a block diagram showing one example of a hard disk unit as one application example of a signal processing circuit relating to the present invention.

FIG. 23 shows one example of a hard disk unit as one application example of the signal processing 33 circuit relating to the present invention.

In FIG. 23, a reference number 81 denotes a magnetically recordable/reproductive hard disk, and 82 denotes a spindle motor for rotary driving the hard disk. A reference number 83 denotes a magnetic head for recording and reproducting data onto and from the hard disk 81. A recording/reproducting amplifier 84 generates a recording current on the magnetic head 83, and amplifies a fine signal obtained from the magnetic head during data reproduction.

A modulator 85 modulates binary data of "1" and "0" into a signal suitable for a magnetic recording. An active filter 86 equalizes a reproduction signal obtained from the recording/reproducting amplifier 84 into a signal of an ideal waveform. A PLL 87 extracts a clock signal from a reproduction signal obtained from the recording/reproducting amplifier 84.

A demodulator 88 reproduces the data obtained from a reproduction signal output from the active filter 86 and a clock signal output from the PLL 87 into original data. A control circuit 89 controls signals among the modulator 85, the demodulator 88 and a host computer 90.

The outline of the recording operation of the hard disk unit will be explained next.

Data to be recorded (recording data) is sent from the host computer 90 to the modulator 85 via the control circuit 89. The data is modulated (conversion) into data strings suitable for a magnetic recording, and the modulated data is sent to the recording/reproducting amplifier 84.

The recording/reproducting amplifier 84 current-amplifies the data sent from the modulator 85, and supplies a recording current to the magnetic head 83. The magnetic head 83 generates a magnetic flux according to the recording current received. A leakage flux generated from a gap formed on purpose on the magnetic head 83 reaches the hard disk 81 that is in rotation. When the magnetic head 83 is moved in a radial direction of the hard disk 81, the hard disk 81 is magnetized on its plane track in a concentric shape, and the data is recorded on this track. In this case, a data recording and data reproduction are not carried out at the same time.

The outline of the data reproduction operation of the hard disk unit will be explained next.

Reproduction is a reproduction of recorded data from the magnetized information on the track of the hard disk 81 in rotation. The magnetic head 83 detects the magnetized information on the track of the hard disk 81 in rotation as a fine reproduction signal.

This reproduction signal is amplified into a predetermined voltage by the recording/reproducting amplifier 84, and is then sent to the active filter 86 and the PLL 87. The active filter 86 corrects the reproduction signal that has been distorted due to the magnetic recording characteristics, and sends the corrected signal to the demodulator 88.

On the other hand, the PLL 87 extracts a clock signal from the reproduction signal, and sends this data to the demodulator 88 in order to reproduced this signal into the original data. The demodulator reproduces the original recording data using the reproduction signal corrected by the active filter 86 and the clock signal output from the PLL 87. The data obtained from the demodulator 88 is sent to the host computer 90 via the control circuit 89. The PLL 87 also sends the frequency signal of the clock signal to the active filter 86.

The operation of the hard disk will be explained next in relation to the signal processing circuit of the present invention.

When data is recorded by the magnetic head 83, the magnetic head 83 is in a stationary state. The recording data is recorded on the hard disk 81 using a constant recording frequency. A recording frequency is set low to the recording data when the magnetic head 83 has moved toward the inner peripheral direction of the hard disk 81. This is for the purpose of achieving an efficient recording by recording data in the same recording density on the hard disk 81 in rotation. In other words, the recording frequency is set low in order to increase the recording data volume. With this arrangement, during the reproduction, the frequency of a reproduction signal is different depending on a physical position of the magnetic head 83. The reproduction signal obtained from the magnetic head 83 becomes lower from the outer periphery toward the inner periphery of the hard disk 81 in rotation.

The reproduction signal is supplied to the active filter 86 via the recording/reproducting amplifier 84.

At the time of correcting (equalizing) the waveform with the active filter 86, it is necessary to change the cutoff frequency of the active filter 86. This is for the purpose of increasing the performance of the hard disk unit by equalizing the reproduction signal at an optimum level.

According to a conventional method, the cutoff frequency of the active filter has been changed automatically based on the position information of the magnetic head obtained from the CPU or the like.

Therefore, according to the hard disk unit shown in FIG. 23, the CPU does not need to control the active filter, and it becomes possible to control the cutoff frequency to obtain higher-precision cutoff frequency. Thus, the characteristics of the hard disk unit can be improved substantially.

Figure 24:
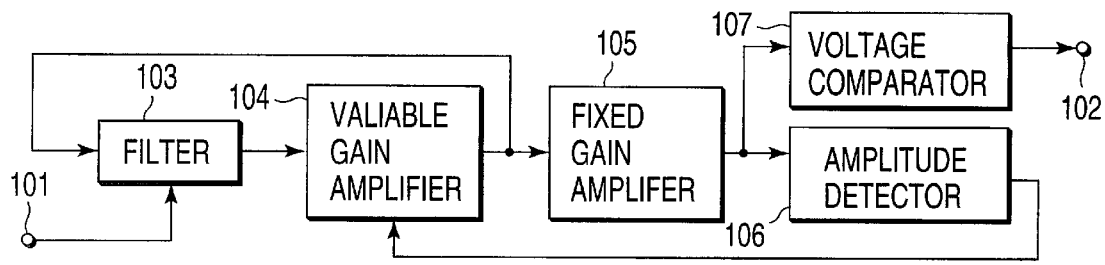
FIG. 24 is a block diagram showing other example of a VCO relating to the present invention.

FIG. 24 shows another example of the VCO relating to the present invention.

Like the VCO described above, the VCO shown in FIG. 24 utilizes phase characteristics of the filter. The VCO is of an analog loop type basically including a delay-time variable filter 103, a variable gain amplifier 104, and an amplitude detector 106, with a fixed gain amplifier 105 and a voltage comparator circuit 107 as additional elements.

The delay-time variable filter 103 is for controlling a signal delay time between an input node and an output node according to a control signal (a voltage or a current) input from a control input node 101. It is preferable to use the delay-time variable filter 103 that is suitable for a high-frequency operation using a small number of elements with little delay time.

The variable gain amplifier 104 is for obtaining an amplification gain according to a gain variable control input, amplifying an output signal of the delay-time variable filter 103, and making a positive feedback of the amplified output signal to the input node of the delay-time variable filter 103. Signal amplitude to be handled by the filter 103 is limited because of the nature of the filter 103. Therefore, it is preferable to limit the signal amplitude of an output signal of the variable gain amplifier 104 accordingly.

The amplitude detector 106 is for detecting tin amplitude of an output signal of the variable gain amplifier 104

(detecting amplitude of an output signal of the fixed gain amplifier 105 in the present example). The amplitude detector 106 is also for generating a negative feedback signal to control the amplitude of the output signal of the variable gain amplifier 104 to have a desired constant value, and for supplying the negative feedback signal as a gain variable control input to the amplitude detector 104. It is preferable to use the amplitude detector 106 that is suitable for a high-frequency operation of the type for detecting a wave having a single frequency spectrum, for example, a sinusoidal waveform. A known synchronous detector may be used for the amplitude detector 106 of the sinusoidal wave detection type. However, it is preferable to use the amplitude detector 106 with an invention in the circuit as described later.

The VCO shown in FIG. 24 has an analog-signal positive feedback system formed by the delay-time variable filter 103 and the variable gain amplifier 104. This VCO also has an analog-signal negative feedback system formed by the variable gain amplifier 104, the fixed gain amplifier 105 and the amplitude detector 106. This construction satisfies conditions for an oscillation (a feedback phase and a feedback level). Based on this construction, the delay-time variable filter 103 outputs a sinusoidal wave signal of a frequency according to a control signal input from the control input node 101.

A BPF (a bandpass filter) or an LPF may be used for the delay-time variable filter 103. When the BPF is used, the input signal and the output signal are in-phase in the center frequency (cutoff frequency). A positive feedback loop may be constructed so that the output signal of this BPF is fed back in-phase. Thus, the construction of the BPF is simple.

On the other hand, when the LPF is used, the input signal and the output signal are in opposite phases in the cutoff frequency. Therefore, a positive feedback loop may be constructed so that the output signal of the LPF is fed back with the phase shifted by 180 degrees.

The fixed gain amplifier 105 is inserted into between the variable gain amplifier 104 and the amplitude detector 106 and connected with these units, for amplifying the output signal of the variable gain amplifier 104 to a level required by the amplitude detector 106. When the amplitude detector 106 has a function of amplification, the fixed gain amplifier 105 may be omitted.

The voltage comparator circuit 107 is for changing L an output signal (a sinusoidal wave signal) of the fixed gain amplifier 105 into a binary signal, and outputting a pulse signal string as a VCO output signal. Depending on the purpose of using the VCO, the voltage comparator circuit 107 may have only a function of amplifying the sinusoidal wave.

In order to reduce the occurrence of frequency variations (jittering) in the output of the VCO particularly jittering attributable to noise in the LSI chip, it is preferable to arrange as follows. That is, a differential construction is used for each of the delay-time variable filter 103, the variable gain amplifier 104, the fixed gain amplifier 105 and the amplitude detector 106 that constitute the VCO shown in FIG. 24.

As explained above, according to the VCO shown in FIG. 24, there is provided the following positive feedback system. That is, the delay-time variable filter 103 controls the delay time according to the control input signal. The output signal of this delay-time variable filter 103 is controlled to a constant level by the AGC circuit including the variable gain amplifier 104 and the amplitude detector 106, thereby making a positive feedback of the signal to the input side of the delay-time variable filter 103. In this positive feedback system, a unit suitable for a high-frequency operation is used for each of the delay-time variable filter 103 and the amplitude detector 106 of the AGC circuit. Thus, it becomes possible to stably oscillate a signal of a few hundred MHz or above. Further, the VCO can be easily realized in an integrated circuit, to facilitate a provision of a low-cost product.

The constituent elements shown in FIG. 24 will be explained in detail next.

Figure 25:
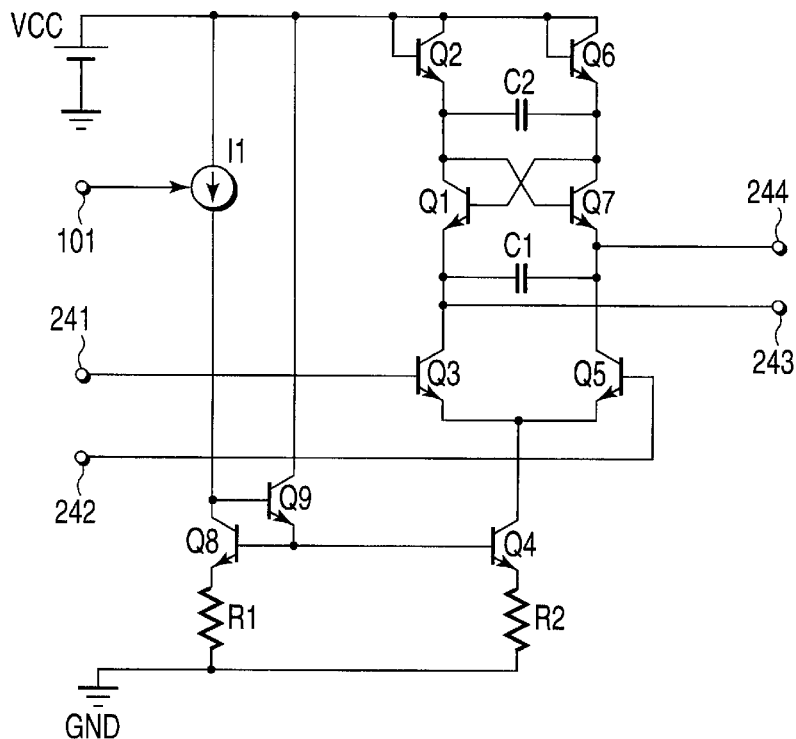
FIG. 25 is a circuit diagram showing a detailed example of a filter shown in FIG. 24.

FIG. 25 shows a detailed example of a case where the delay-time variable filter 103 shown in FIG. 24 is constructed using bipolar transistors.

In FIG. 25, reference symbols Q1 to Q9 denote npn transistors, C1 and C2 denote capacitors, R1 and R2 denote resistors, I1 denotes a constant current source, VCC denotes a power source potential, and GND denotes a ground potential. A reference number 101 denotes a control input node, 241 and 242 denote input nodes to which a differential input signal voltage is applied respectively, and 243 and 244 denote output nodes to which a differential output signal voltage is applied respectively.

The transistor Q2 has a collector and a base mutually connected to each other, with the collector connected to a VCC node, and with an emitter connected to a collector of the transistor Q1 as well as to a base of the transistor Q7.

The transistor Q6 has a collector and a base mutually connected to each other, with the collector connected to the VCC node, and with an emitter connected to a base of the transistor Q1 as well as to a collector of the transistor Q7. In other words, the transistors Q1 and Q7 have their bases and collectors mutually connected in cross.

The capacitor C1 is connected between the emitters of the transistors Q1 and Q7, with the capacitor C2 connected between the collectors of the transistors Q1 and Q7.

The input transistors Q3 and Q5 forming a differential pair have their collectors connected to the emitters of the transistors Q1 and Q7. A collector and an emitter of one transistor Q4 for a current source and the resistor R2 are connected in series between the emitter-common connected node and the GND node.

A differential feedback input signal is input to bases of the input transistors Q3 and Q5 forming the differential pair, and a differential output signal is taken out from each collector.

The constant current source I1, a collector and an emitter of the transistor Q8 and the resistor R1 are connected in series between the VCC node and the GND node. A collector and an emitter of the transistor Q9 are connected between the VCC node and a base of the transistor Q8. A base of the transistor Q9 is connected to a collector of the transistor Q8. A base of the transistor Q8 is connected to a base of the current source transistor Q4. The transistors Q8, Q9 and Q4 and the resistors R2 and R1 constitute a current mirror circuit. A control signal from the control input node 101 is input to the constant current source I1. The current of the current source I1 changes according to a control signal input.

In the present example, the capacitor C1 is directly connected to between the emitters of the transistors Q1 and Q7. However, the capacitor C1 may be substantially connected to between the emitters of the transistors Q1 and Q7. Further, in the present example, the capacitor C2 is directly connected to between the collectors of the transistors Q1 and Q7. However, the capacitor C2 may be substantially connected to between the collectors of the transistors Q1 and Q7.

In the filter of the above construction, a current proportional to a current of the current source I1 that changes according to the control signal input flows through the transistor Q4. As a result, a cutoff frequency changes according to the control signal input, and delay time characteristics (phase characteristics) change.

A transfer function G(s) from input nodes 241 and 242 to output nodes 243 and 244 of the circuit shown in FIG. 25 is obtained as given by the following expression (19) based on a procedure similar to that of the expressions (1) to (11) relating to the LPF.

$$G(S) = \frac{\frac{\omega n}{Q}S}{S^2 + \frac{Wn}{Q}S + Wn^2} \tag{19}$$

In the above expression (19), S represents a Laplace operator, and ωn represents an angular frequency. From the transfer function of the expression (19), it can be known that the circuit characteristics of the transistors Q1 to Q7 and the capacitors C1 and C2 shown in FIG. 25 have a secondary BPF (bandpass filter) transfer function. From a general expression of the transfer function of the filter circuit, there is obtained a relationship among the angular frequency ωn, a selectivity Q, a value C1 of the capacitor C1, and a value C2 of the capacitor C2, as shown by the following expression.

$$\omega n = \sqrt{\frac{1}{C1 \cdot C2 \cdot (re + re)^2}} \tag{20}$$

$$Q = \sqrt{\frac{C1}{C2}} \tag{21}$$

From the expression (20), it can be known that the angular frequency ωn is determined by the capacity and a Shockley emitter resistance re. From the expression (21), it can be known that Q is determined by the rate of the two capacitors C1 and C2.

In the above expression (20), the emitter resistance re is determined one-sidedly by the size of the collector current of the transistor, and is given by the following expression.

$$re = k \cdot T/q \cdot Ic \; (\Omega) \tag{22}$$

where k represents a Boltzmann constant, q represents a charge volume, and T represents an absolute temperature.

The phase characteristics of the BPF have a phase angle of 0 degree in the cutoff frequency as is clear from the expression (19).

When the signal amplitude handled by the filter circuit shown in FIG. 25 becomes larger, the value of the phase angle is deviated from a desired value of 0 degrees in the cutoff frequency. Therefore, this signal amplitude is preferably about 10 mV. In the filter circuit shown in FIG. 25, diodes may be used in place of the transistors Q2 and Q6.

Figure 26:
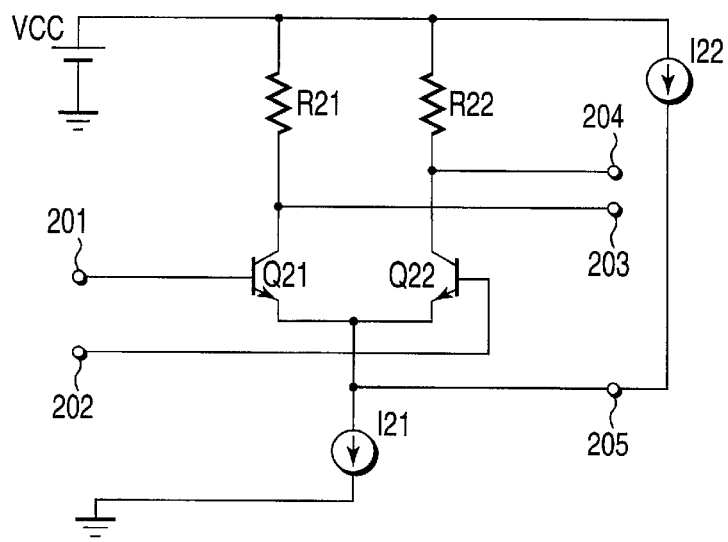
FIG. 26 is a circuit diagram showing one detailed example of a variable gain amplifier shown in FIG. 24.

FIG. 26 shows one detailed example of the variable gain amplifier 104.

In FIG. 26, npn transistors Q21 and Q22 have their emitters connected together in common to form a differential pair. Load resistors R21 and R22 are connected between collectors of the transistors Q21 and Q22 and a VCC node respectively. A current source I21 is connected between the emitter-common connected node and the GDN node. All these elements constitute a differential amplifier. Bases of the transistors Q21 and Q22 are connected to differential input nodes 201 and 202 respectively, and collectors of the transistors Q21 and Q22 are connected to differential output nodes 203 and 204 respectively.

A gain control current source I22 is connected between the VCC node and the emitter-common connected node. The current value of the gain control current source I22 and the current value of the differential amplifier current source I21 is set to have a relationship of I21>I22. In other words, the gain control current source I22 is connected between the VCC node and the emitter-common connected node so that the output current (gain control current) of the gain control current source I22 flows to the differential amplifier current source I21 via a gain control node 205.

The gain of the variable gain amplifier of the differential construction shown in FIG. 26 is determined by the collector current of the differential pair transistors Q21 and Q22 and the load resistors R21 and R22. In the present example, when the current value of the gain control current source I22 changes, the collector current (I21–I22) of the differential pair transistors Q21 and Q22 changes. Thus, the gain of the amplitude detector is controlled. The amplitude of the output signal of the variable gain amplifier is designed to become about 10 mV, for example, because of the limit of the signal amplitude handled by the filter 103 as described above.

FIG. 27 shows one detailed example of the fixed gain amplifier 105 shown in FIG. 24.

As explained above, the amplitude of the signal supplied from the variable gain amplifier 104 is about 10 mV. There is some inconvenience in the precision for the amplitude detector 106 to directly detect the signal amplitude of this size. It is preferable to increase the amplitude of the signal in order to increase the detection precision of the amplitude detector 106. When a DC offset voltage is generated in the signal to be input to the amplitude detector 106, this affects the detection precision. Therefore, in order to remove the DC offset voltage from the output of the fixed gain amplifier 105, it is preferable that the fixed gain amplifier 105 has a function of a HPF (high-pass filter).

In FIG. 27, npn transistors Q41 and Q42 have a current source I41 and a current source I42 connected between each emitter and a GND node respectively, and have load resistors R41 and R42 connected between each collector and a VCC node respectively. A series circuit of a resistor R43 and a capacitor C41 is connected between emitters of the transistors Q41 and Q42. The transistors Q41 and Q42 have their bases connected to differential input nodes 401 and 402 respectively, with respective collectors connected to differential output nodes 403 and 404 respectively.

The fixed gain amplifier of the differential construction shown in FIG. 27 has a role of removing the DC offset voltage by the HPF consisting of the resistor R43 and the capacitor C41 connected between the emitters of the transistors Q41 and Q42.

FIG. 28 shows a detailed example of the sinusoidal wave type amplitude detector 106 shown in FIG. 24.

In FIG. 28, npn transistors Q51 and Q52 have their emitters connected together in common to form a differential pair. A first current source I52 is connected between the emitter-common connected node and a GND node. The differential pair and the first current source I52 constitute a first differential amplifier. The transistors Q51 and Q52 have their bases connected to differential input nodes 501 and 502 respectively. Current driving capacities (the emitter size or the number of transistors) are different between the transistors Q51 and Q52. In the present example, the size of the transistor Q51 is four times the size of the transistor Q52.

On the other hand, npn transistors Q53 and Q54 have their emitters connected together in common to form a differential pair. A second current source I53 is connected between the emitter-common connected node and the GND node. The differential pair and the second current source I53 constitute a second differential amplifier. The transistors Q53 and Q54 have their bases connected to the differential input nodes 502 and 501 respectively. Current driving capacities (the emitter size or the number of transistors) are different between the transistors Q53 and Q54. In the present example, the size of the transistor Q53 is four times the size of the transistor Q54.

In the above two differential amplifiers, collectors of the transistors of a larger size are connected together, and collectors of the other transistors of a smaller size are connected together. In the present example, the collector-common connected node of the transistors Q51 and Q53 is directly connected to the VCC node. An emitter and a collector of a third current source pnp transistor Q56 are connected to between the VCC node and a collector-common connected node of the transistors Q52 and Q54.

On the other hand, an emitter and a collector of a pnp transistor Q55 and a current source I51 are connected in series between the VCC node and the GND node, with a base and the collector of the transistor Q55 mutually connected to each other. The transistor Q55 and the transistor Q56 have their bases connected together to form a current mirror circuit. The collector current of the transistor Q55 and the collector current of the transistor Q56 are equal (or are proportional). A series circuit of a resistor R51 and a capacitor C51 is connected between collectors of the transistor Q55 and the transistor Q56. The resistor R51 and the capacitor C51 have a function of an LPF for removing a higher harmonic component.

An emitter and a collector of a pnp transistor Q57 are connected in parallel with the transistor Q56. The transistor Q57 has a base and a collector mutually connected to each other. The transistor Q57 and the pnp transistor Q58 have their emitters connected to each other and have their bases connected to each other to form a current mirror circuit. The collector current of the transistor Q57 and the collector current of the transistor Q58 are equal (or are proportional). It is preferable that an LPF is inserted into between the collector of the transistor Q58 and the current output node 503 in order to remove a higher harmonic component. An LPF of the example consists of the resistor R52 inserted into between the collector of the transistor Q58 and the current output node 503 and a capacitor C52 connected between the collector of the transistor Q58 and the GND node.

The transistors Q57 and Q58 and the current output node (amplitude detection output node) 503 correspond to the gain control current source I22 in the variable gain amplifier and the gain control node 205 shown in FIG. 26.

The operation of the amplitude detector of differential construction shown in FIG. 28 will be explained next.

As explained above, the transistors Q55 and Q56 constitute a current mirror circuit, and the current supplied from the transistor Q56 is equal to the current of the current source I51. In the present example, the current of the current source I51 is set to a half of the current of the current source I52, and the current of the current source I53 is set equal to the current of the current source I52.

First, a state of a current when the differential input nodes 501 and 502 have no signal (that is, a voltage difference between the input node 501 and the input node 502 is zero) will be explained. As the emitter size of the transistor Q51 is set four times the emitter size of the transistor Q52, when there is no signal, the current ratio of the collector current of the transistor Q51 to the collector current of the transistor Q52 is four to one as explained above. Thus, the transistor Q51 has a larger current. Similarly, the current ratio of the collector current of the transistor Q53 to the collector current of the transistor Q54 is four to one as explained above, and the transistor Q53 has a larger current.

Next, there will be observed a state of a current of the collector-connected node of the transistors Q52 and Q54 when there is no signal. When the current of the current source I52 is expressed as Ic, the collector current of the transistor Q56 is Ic/2 as explained above. On the other hand, the sum of the collector current of the transistor Q52 and the collector current of the transistor Q54 is 2·Ic/5. During a no-signal period, the collector current of the transistor Q56 becomes larger than the sum of the collector currents of the transistors Q52 and Q54. Thus, the transistor Q56 is saturated, and the collector potential becomes substantially equal to the emitter potential. As a result, the transistor Q57 becomes in a cutoff state, and the collector current of the transistor 58 does not flow, with no current supplied to the current output node 53.

Next, a case when a sinusoidal wave signal has been applied to the differential input nodes 501 and 502 will be explained.

The collector current ratio of the transistors Q51 to Q52 is four to one during a no-signal period as explained above. However, when a signal has been applied to the differential input nodes 501 and 502, the collector current ratio of the transistors Q51 to Q52 is different according to the amplitude of the signal applied. In this case, when a large signal has been applied, the collector current ratio of the transistors Q51 to Q52 becomes close to one to one. For example, when the current of the current source I52 is 100 $\mu$A, the collector current of the transistors Q51 and Q52 becomes 50 $\mu$A respectively. When the collector current ratio of the transistor Q51 to Q52 (that is, a value obtained by dividing the collector current of the transistor Q52 by the collector current of the transistor Q51) is K, the range of K is given by the following expression.

$$(1/N) \leq K \leq 1 \tag{23}$$

where N represents a magnification of the emitter size of the transistor Q51 to the emitter size of the transistor Q52.

The collector current ratio of the transistor Q53 to Q54 also has a collector current ratio similar to that of the transistor Q51 to Q52.

In the above expression (23), N takes a value of 4 in the present example. Therefore, when the current of the current source I52 is 100 $\mu$A, the current that flows to the transistor Q52 has a range from 20 $\mu$A to 50 $\mu$A.

Therefore, the difference current (the collector current that flows to the transistor Q58) is supplied to the current output node 503 via the resistor R52. The gain of the variable gain amplifier shown in FIG. 26 is controlled based on the output current of the current output node 503. In the above expression (23), it is preferable that K is set to a value of about the center of the range.

FIG. 29 shows a result of a simulation of convergence characteristics of signal amplitude of an output signal in the variable gain amplifier shown in FIG. 26 along the lapse of time. In FIG. 29, a horizontal axis represents time and a vertical axis represents signal amplitude. From this characteristic diagram, it is possible to confirm the operation during a period from when a power source voltage has been applied till when the signal output waveform converges to a desired level of signal amplitude.

The sinusoidal wave detection type amplitude detector of the differential construction in FIG. 28 has a first differential amplifier and a second differential amplifier connected in parallel between a VCC node and a GND node. Each differential amplifier has two transistors of different sizes connected to form a differential pair. Output electrodes of transistors of a larger size in these differential input pair of transistors are connected together to a first node, and output electrodes of the other transistors of a smaller size in these differential input pair of transistors are connected together to a second node. The amplitude detector detects amplitude of a differential input signal of the differential input nodes 501 and 502 as a relative current change of the first node and the second node. Then, the amplitude detector outputs a result of the detection (a detected current in the present example) to the output node 503. In the present example, a first current source I52 is connected between the differential input pair of transistors of the first differential amplifier and a ground node. A second current source I53 is connected between the differential input pair of transistors of the second differential amplifier and the ground node. The first node is directly connected to the VCC node, and a third current source Q56 is connected between the VCC node and the second node. The current of the first current source I52 is set equal to the current of the second current source I53, and the current of the third current source Q56 is set smaller than the current of the first current source I52. The current change of the second node is taken out as a detected output.

In place of the sinusoidal wave-detection amplitude detector of the differential construction in FIG. 28, it is also possible to use other sinusoidal wave-detection amplitude detector, such as, for example, a known multiplication (square) type synchronous detector of a differential construction as shown in FIG. 30.

According to this synchronous detector, a collector of one of a first differential pair of transistors 291 and a collector of one of a second differential pair of transistors 292 are connected together in common. The common-connected collectors are connected to a VCC node via a negative resistor 293. A transistor connected to an emitter-common connected node of the first differential pair of transistors 291 and a transistor connected to an emitter-common connected node of the second differential pair of transistors 292 form a third differential pair of transistors 294. A current source 295 is connected between an emitter-common connected node of the third differential pair of transistors 294 and the GND node.

A differential input signal is applied to an emitter follower circuit 296. A differential output signal of the emitter follower circuit 296 is applied to the first differential pair of transistors 291 and the second differential pair of transistors 292, and is also applied to the third differential pair of transistors 294 via a level shift circuit 297.

The amplitude detector of the construction shown in FIG. 28 can operate at a low power-source voltage and can operate at high speed. Therefore, this amplitude detector is suitable for detecting an amplitude of a high-frequency signal, as compared with a multiplication type synchronous detector that has transistors connected at two stages between the VCC node and the GND node as shown in FIG. 30.

As explained above, according to the VCO of the present invention, a delay-time variable filter controls a delay time according to a control signal input. An output signal of the delay-time variable filter is changed into a binary pulse signal, and this signal is positively fed back to the input side of the delay-time variable filter at a desired level. Therefore, it is possible to provide a simple construction in an integrated circuit by omitting an AGC circuit. Further, it is also possible to supply a low-cost product.

Further, according to the VCO of the present invention, there is provided a system in which a delay-time variable filter controls a delay time according to a control signal input. An output signal of the delay-time variable filter is controlled at a constant level by an AGC circuit and is positively fed back to the input side of the delay-time variable filter. Based on this system, there are provided inventive constructions of the filter and the AGC circuit. As a result, it is possible to stably oscillate a signal in a high-frequency area, particularly, in excess of a few hundred MHz. The system can be realized in an integrated circuit. It is also possible to supply a low-cost product.

Further, according to the PLL of the present invention, it is possible to carry out a stable PLL operation and to generate a high-quality clock, by having the VCO of the present invention built into the PLL. Therefore, it is possible to substantially decrease the rate of reading error in the storage unit on which the present PLL is mounted. It is also possible to increase the reliability of the device, with improved production efficiency.

Further, according to the signal processing circuit of the present invention, the PLL of the present invention and the active filter are linked to each other. The control input voltage of the VCO in the PLL is used as a control signal for setting the cutoff frequency of the active filter. With this arrangement, it is possible to make the PLL input clock frequency and the active filter cutoff frequency coincide with each other or proportional to each other. As a result, it is possible to cancel aggravation in the characteristics of the active filter due to variance in the capacity of capacitors that is a drawback on the manufacturing of integrated circuits.

Further, when a correction circuit is added to a signal processing circuit of the present invention, it is possible to precisely control the cutoff frequency of the active filter even in a high-frequency area where a parasitic delay in the VCO cannot be disregarded. When this is linked to the VCO of the present invention, it is possible to realize the signal processing circuit in a simple circuit construction. As a result, it is possible to supply a low-cost integrated circuit without an increase in the manufacturing cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage-controlled oscillator comprising:
   a delay-time variable filter having a signal input node, a signal output node and a control signal input node, a signal delay time between the signal input node and the signal output node being controlled according to a control signal input from the control signal input node;
   a variable gain amplifier having a gain variable control signal input node, and having an amplification gain according to a gain variable control signal input from the gain variable control signal input node, configured to receive an output signal of the delay-time variable filter, amplify this received output signal, and provide a positive feedback of the amplified signal to the signal input node of the delay-time variable filter; and
   a sinusoidal wave detection-type amplitude detector configured to receive an amplitude corresponding to an output signal of the variable gain amplifier, detect the received amplitude, generate a negative feedback signal for controlling the amplitude corresponding to the output signal of the variable gain amplifier so that the amplitude substantially becomes a desired constant value, and supply the negative feedback signal to the gain variable control signal input node of the variable gain amplifier as the gain variable control signal.

2. The voltage-controlled oscillator according to claim 11, wherein the delay-time variable filter is a bandpass filter, and the variable gain amplifier feeds back to the delay-time variable filter a signal that is in phase with a sinusoidal wave signal output from the bandpass filter.

3. The voltage-controlled oscillator according to claim 1, further comprising:

a fixed gain amplifier that is inserted between the variable gain amplifier and the amplitude detector, configured to receive the output signal from the variable gain amplifier, amplify this signal, and apply the amplified signal to the amplitude detector.

4. The voltage-controlled oscillator according to claim 3, wherein the fixed gain amplifier has a function of highpass filter.

5. The voltage-controlled oscillator according to claim 3, further comprising:

a voltage comparator circuit configured to receive an output signal of the fixed gain amplifier, change this signal into a binary signal, and output a pulse signal string as a voltage-controlled oscillation output.

6. The voltage-controlled oscillator according to claim 1, wherein the delay-time variable filter has a differential input node and a differential output node, the signal delay time between the differential input node and the differential output node being controlled according to the control signal input from the control signal input node, the variable gain amplifier has a differential input node and a differential output node, amplifies a differential input signal input from the differential input node, and positively feeds back a differential output signal output from the differential output node to the differential input node of the delay-time variable filter, and the amplitude detector has a differential input node and a differential output node, receive a differential input signal to the differential input node, detects an amplitude of this signal, generates the negative feedback signal for controlling an amplitude of the differential output signal of the variable gain amplifier so that the amplitude substantially becomes a desired constant value, and outputs the negative feedback signal from the differential output node.

7. The voltage-controlled oscillator according to claim 1, wherein the amplitude detector amplifies the output signal of the variable gain amplifier and detect the amplitude.

8. The voltage-controlled oscillator according to claim 6, wherein the amplitude detector has a first differential amplifier and a second differential amplifier connected in parallel between a power supply node and a ground node, each of the first and second differential amplifiers having a pair of transistors with different sizes to form a differential pair each transistor having an output electrode, output electrodes of transistors of a larger size in these pairs of differential transistors are coupled together to a first node, and output electrodes of the other transistors of a smaller size in these pairs of differential transistors are coupled together to a second node, whereby to detect a relative change in currents flowing through the first node and the second node.

9. The voltage-controlled oscillator according to claim 8, wherein the amplitude detector further has:

a first current source connected between the differential pair of the first differential amplifier and the ground node;

a second current source connected between the differential pair of the second differential amplifier and the ground node; and a third current source connected between the power supply node and the second node, and the first node is directly connected to the power supply node, the current of the first current source and the current of the second current source are approximately set equal to each other, the current of the third current source is set smaller than the current of the first current source, and a change in the current of the second node is taken out as a detected output.

* * * * *

UNITED STATES PATENT AND TRADEMARK OFFICE
CERTIFICATE OF CORRECTION

PATENT NO. : 6,344,778 B1  Page 1 of 1
DATED : February 5, 2002
INVENTOR(S) : Nakamura et al.

It is certified that error appears in the above-identified patent and that said Letters Patent is hereby corrected as shown below:

<u>Title page,</u>
Item [30], Foreign Application Priority information should read:

-- [30]  Foreign Application Priority Data

Jun. 18, 1999  (JP) ..................................... 11-173014
    May 30, 2000  (JP) ................................ 2000-160191 --

Signed and Sealed this

Eleventh Day of June, 2002

Attest:

Attesting Officer

JAMES E. ROGAN
*Director of the United States Patent and Trademark Office*